US012761762B2

(12) United States Patent
Park

(10) Patent No.: US 12,761,762 B2
(45) **Date of Patent: *Oct. 13, 2026**

(54) INPUT SENSOR AND DISPLAY DEVICE INCLUDING THE SAME

(71) Applicant: Samsung Display Co., Ltd., Yongin-si (KR)

(72) Inventor: Jungmok Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/274,364

(22) Filed: Jul. 18, 2025

(65) Prior Publication Data

US 2025/0348175 A1 Nov. 13, 2025

Related U.S. Application Data

(63) Continuation of application No. 18/402,608, filed on Jan. 2, 2024, now Pat. No. 12,386,469, which is a continuation of application No. 18/091,397, filed on Dec. 30, 2022, now Pat. No. 11,880,221, which is a continuation of application No. 16/986,134, filed on Aug. 5, 2020, now Pat. No. 11,543,924.

(30) Foreign Application Priority Data

Sep. 6, 2019 (KR) ........................ 10-2019-0110525

(51) Int. Cl.

| | |
|---|---|
| ***G06F 3/044*** | (2006.01) |
| ***G06F 3/041*** | (2006.01) |
| ***H10K 59/40*** | (2023.01) |

(52) U.S. Cl.
CPC .......... *G06F 3/0445* (2019.05); *G06F 3/0412* (2013.01); *H10K 59/40* (2023.02)

(58) Field of Classification Search
CPC ............................ G06F 3/0445; G06F 3/0412
USPC .......................................................... 345/174
See application file for complete search history.

(56) References Cited

U.S. PATENT DOCUMENTS

| | | | |
|---|---|---|---|
| 9,236,421 | B2 | 1/2016 | Lee |
| 9,269,408 | B2 | 2/2016 | Yamaki |
| 9,886,127 | B2 | 2/2018 | Choi |
| 10,146,336 | B2 | 12/2018 | Lee et al. |
| 10,481,729 | B2 | 11/2019 | Park |
| 10,698,513 | B2 | 6/2020 | Na et al. |
| 10,712,889 | B2 | 7/2020 | Park et al. |

(Continued)

FOREIGN PATENT DOCUMENTS

| | | | |
|---|---|---|---|
| CN | 104007876 | A | 8/2014 |
| CN | 108231835 | A | 6/2018 |

(Continued)

OTHER PUBLICATIONS

Non-Final Office Action dated Mar. 17, 2022, in U.S. Appl. No. 16/986,134 (submitted in grandparent).

(Continued)

*Primary Examiner* — Calvin C Ma
(74) *Attorney, Agent, or Firm* — Womble Bond Dickinson (US) LLP

(57) ABSTRACT

An input sensor and display device including the same are capable of sensing a touch (or touch interaction) by a user's body and a touch by an electronic pen.

20 Claims, 26 Drawing Sheets

(56) References Cited

U.S. PATENT DOCUMENTS

| | | | | |
|---|---|---|---|---|
| 11,880,221 | B2 | 1/2024 | Park | |
| 12,386,469 | B2 * | 8/2025 | Park | G06F 3/0445 |
| 2013/0285939 | A1 | 10/2013 | Kim et al. | |
| 2015/0317008 | A1 | 11/2015 | Chandran et al. | |
| 2017/0242534 | A1 * | 8/2017 | Gray | G06F 3/041662 |
| 2018/0300007 | A1 * | 10/2018 | Xu | G06F 3/0445 |
| 2019/0004649 | A1 | 1/2019 | Ju et al. | |
| 2019/0114070 | A1 | 4/2019 | Youn | |
| 2019/0129553 | A1 | 5/2019 | Oh et al. | |
| 2019/0317626 | A1 * | 10/2019 | Lee | G06F 3/0416 |
| 2020/0026376 | A1 * | 1/2020 | Lee | G06F 3/0412 |
| 2020/0257429 | A1 * | 8/2020 | Hisano | G06F 3/04182 |
| 2020/0310580 | A1 * | 10/2020 | Han | G06F 3/0414 |
| 2021/0263631 | A1 * | 8/2021 | Kim | G06F 3/03545 |

FOREIGN PATENT DOCUMENTS

| | | | |
|---|---|---|---|
| KR | 10-2014-0077000 | A | 6/2014 |
| KR | 10-2015-0004029 | A | 1/2015 |
| KR | 10-1653719 | B1 | 9/2016 |
| KR | 10-2017-0060833 | A | 6/2017 |
| KR | 10-2018-0014393 | A | 2/2018 |
| KR | 10-2018-0046708 | A | 5/2018 |
| KR | 10-2019-0003148 | A | 1/2019 |
| KR | 10-2019-0025798 | A | 3/2019 |
| KR | 10-2019-0041826 | A | 4/2019 |
| KR | 10-2019-0047168 | A | 5/2019 |
| KR | 10-1975596 | B1 | 5/2019 |

OTHER PUBLICATIONS

Notice of Allowance dated Aug. 15, 2022, in U.S. Appl. No. 16/986,134.

Notice of Allowance dated Sep. 13, 2023, in U.S. Appl. No. 18/091,397.

Chinese Office action issued in corresponding application No. CN 202010823384.2, dated Jan. 8, 2026, 6 pages.

* cited by examiner

INPUT SENSOR AND DISPLAY DEVICE INCLUDING THE SAME

CROSS-REFERENCE TO RELATED APPLICATIONS

This application is a Continuation of U.S. patent application Ser. No. 18/402,608, filed Jan. 2, 2024, which is a Continuation of U.S. patent application Ser. No. 18/091,397, filed on Dec. 30, 2022, now U.S. Pat. No. 11,880,221, granted Jan. 23, 2024, which is a Continuation of U.S. patent application Ser. No. 16/986,134, filed on Aug. 5, 2020, now U.S. Pat. No. 11,543,924, granted Jan. 3, 2023, which claims priority to and the benefit of Korean Patent Application No. 10-2019-0110525, filed Sep. 6, 2019, each which is hereby incorporated by reference for all purposes as if fully set forth herein.

BACKGROUND

Field

Some embodiments of the invention generally relate to a display device, and more particularly, to a display device including an input sensor.

Discussion

Multimedia display devices, such as televisions, mobile phones, tablet computers, navigators, game consoles, and the like, are provided to display an image. Such a display device may include an input sensor, which is capable of providing a touch-based input manner that allows a user to easily input information or commands intuitively and conveniently in addition to usual input manners, such as inputs via a button, a keyboard, a mouse, and the like.

The input sensor may sense a touch or pressure using a user's body. There is an increasing demand for using an electronic pen for fine touch input for a user who is familiar with information input using a writing instrument or an application program (for example, an application program for sketching or drawing). Accordingly, there is interest in an input sensor capable of sensing not only an electronic pen input, but also at least one of an input by a touch or pressure interaction via a user's body.

The above information disclosed in this section is only for understanding the background of the inventive concepts, and, therefore, may contain information that does not form prior.

SUMMARY

Input sensors constructed according to the principles and some embodiments of the invention are capable of sensing a touch (or touch interaction) by a user's body and a touch by an electronic pen.

Display devices constructed according to the principles and some embodiments of the invention include an input sensor capable of sensing a touch (or touch interaction) by a user's body and a touch by an electronic pen.

Additional features of the invention will be set forth in the detailed description which follows, and, in part, will be apparent from the disclosure, or may be learned by practice of the inventive concepts.

According to some aspects of the invention, an input sensor includes a plurality of first sensing electrodes, a plurality of second sensing electrodes, a plurality of first sensing lines, a plurality of second sensing lines, a first connection line, and a second connection line. The plurality of first sensing lines are electrically connected to the plurality of first sensing electrodes, respectively. The plurality of second sensing lines are electrically connected to the plurality of second sensing electrodes, respectively. The first connection line electrically connects a pair of first sensing electrodes of the plurality of first sensing electrodes. The second connection line electrically connects a pair of second sensing electrodes of the plurality of second sensing electrodes.

According to some aspects of the invention, an input sensor includes a plurality of first sensing electrodes, a plurality of second sensing electrodes, a plurality of first sensing lines, a plurality of second sensing lines, a plurality of third sensing lines, and a plurality of fourth sensing lines. Each of the plurality of first sensing electrodes includes a plurality of first sub-sensor parts, a plurality of second sub-sensor parts, and a plurality of first sub-connection parts. The plurality of second sensing electrodes are insulated from the plurality of first sensing electrodes. Each of the plurality of second sensing electrodes includes a plurality of third sub-sensor parts, a plurality of fourth sub-sensor parts, and a plurality of second sub-connection parts. The plurality of first sensing lines are electrically connected to first ends of the plurality of first sensing electrodes, respectively. The plurality of second sensing lines are electrically connected to first ends of the plurality of second sensing electrodes, respectively. The plurality of third sensing lines are disposed between the plurality of third sub-sensor parts and the plurality of fourth sub-sensor parts. Each of the plurality of third sensing lines have one end electrically connected to a second end of a corresponding one of the plurality of first sensing electrodes. The plurality of fourth sensing lines are disposed between the plurality of first sub-sensor parts and the plurality of second sub-sensor parts. Each of the plurality of fourth sensing lines have one end electrically connected to a second end of a corresponding one of the plurality of second sensing electrodes. The plurality of first sub-connection parts electrically connect the plurality of first sub-sensor parts to the plurality of second sub-sensor parts. The plurality of second sub-connection parts electrically connect the plurality of third sub-sensor parts to the plurality of fourth sub-sensor parts.

According to some aspects of the invention, an input sensor includes a plurality of first sensing electrodes; a plurality of second sensing electrodes; a plurality of first sensing lines; a plurality of second sensing lines; a plurality of third sensing lines; and a plurality of fourth sensing lines. Each of the plurality of first sensing electrodes includes a plurality of first sub-sensor parts, a plurality of second sub-sensor parts, and a plurality of first sub-connection parts. The plurality of second sensing electrodes are insulated from the plurality of first sensing electrodes. Each of the plurality of second sensing electrodes includes a plurality of third sub-sensor parts, a plurality of fourth sub-sensor parts, and a plurality of second sub-connection parts. The plurality of first sensing lines are electrically connected to first ends of the plurality of first sensing electrodes, respectively. The plurality of second sensing lines are electrically connected to first ends of the plurality of second sensing electrodes, respectively. The plurality of third sensing lines are disposed between the plurality of first sub-sensor parts and the plurality of second sub-sensor parts. The plurality of fourth sensing lines are disposed between the plurality of third sub-sensor parts and the plurality of fourth sub-sensor parts. A pair of corresponding third sensing lines of the plurality of third sensing lines are electrically connected to each other. A pair of corresponding fourth sensing lines of the plurality of fourth sensing lines are electrically connected to each other. The plurality of first sub-connection parts and the plurality of second sub-connection parts are formed from a first conductive layer. The plurality of first to fourth sub-sensor parts and the plurality of first to fourth sensing lines are formed from a second conductive layer. An insulation layer is disposed between the first conductive layer and the second conductive layer.

According to some aspects of the invention, a display device includes a display panel configured to display an image, an input sensor disposed on a first surface of the display panel, and a sensing circuit configured to receive first input information and second input information from the input sensor. The input sensor includes a plurality of first sensing electrodes, a plurality of first sensing lines, a plurality of second sensing electrodes, a plurality of second sensing lines, a first connection line, and a second connection line. The plurality of first sensing lines are electrically connected to the plurality of first sensing electrodes, respectively. The plurality of second sensing lines are electrically connected to the plurality of second sensing electrodes, respectively. The first connection line electrically connects a pair of first sensing electrodes of the plurality of first sensing electrodes. The second connection line electrically connects a pair of second sensing electrodes of the plurality of second sensing electrodes. The sensing circuit is further configured to receive the first input information through the plurality of first sensing lines and the plurality of second sensing lines in a first sensing mode, and to receive the second input information through the plurality of first sensing lines and the plurality of second sensing lines in a second sensing mode.

According to some aspects of the invention, an input sensor includes: a plurality of first sensing electrodes, each of which has a plurality of first sensor parts, a plurality of second sensor parts and a plurality of first connection parts; a plurality of second sensing electrodes insulated from the plurality of first sensing electrodes, each of the plurality of second sensing electrodes having a plurality of third sensor parts, a plurality of fourth sensor parts and a plurality of second connection parts; a plurality of first sensing lines, each of which is electrically connected to a corresponding one of the plurality of first sensing electrodes; a plurality of second sensing lines, each of which is electrically connected to a corresponding one of the plurality of second sensing electrodes; a plurality of third sensing electrodes, each of which is disposed between a corresponding one among the plurality of first sensor parts and a corresponding one among the plurality of second sensor parts; and a plurality of fourth sensing electrodes, each of which is disposed between a corresponding one among the plurality of third sensor parts and a corresponding one among the plurality of fourth sensor parts; wherein two of the plurality of third sensing electrodes are electrically connected to each other and two of the plurality of fourth sensing electrodes are electrically connected to each other.

The plurality of first connection parts and the plurality of second connection parts may be formed from a first conductive layer; the plurality of first to fourth sensor parts, the plurality of third sensing electrodes and the plurality of fourth sensing electrodes may be formed from a second conductive layer; and an insulation layer may be disposed between the first conductive layer and the second conductive layer.

The plurality of second sensing electrodes may extend in a first direction and may be arranged in a second direction crossing the first direction; the plurality of first sensing electrodes may extend in the second direction and may be arranged in the first direction; the plurality of first sensor parts and the plurality of second sensor parts may be spaced apart from each other in the second direction; and the plurality of third sensor parts and the plurality of fourth sensor parts may be spaced part from each other in the first direction.

The plurality of first sensing electrodes and the plurality of second sensing electrodes may be insulated from each other.

The plurality of first sensing electrodes and the plurality of second sensing electrodes may be configured to sense a touch input during a first sensing mode; and the plurality of third sensing electrodes and the plurality of fourth sensing electrodes may be configured to sense a pen input during a second sensing mode.

The plurality of third sensing electrodes may include a plurality of third sensing lines; and the plurality of fourth sensing electrodes may include a plurality of fourth sensing lines.

One ends of the two of the plurality of third sensing lines may be electrically connected to each other; and one ends of the two of the plurality of fourth sensing lines may be electrically connected to each other.

According to some aspects of the invention, an input sensor includes: a plurality of first touch electrodes, each of which has a plurality of first sensor parts, a plurality of second sensor parts and a plurality of first connection parts; a plurality of second touch electrodes insulated from the plurality of first touch electrodes, each of the plurality of second touch electrodes having a plurality of third sensor parts, a plurality of fourth sensor parts and a plurality of second connection parts; a plurality of first sensing lines, each of which is electrically connected to a corresponding one of the plurality of first touch electrodes; a plurality of second sensing lines, each of which is electrically connected to a corresponding one of the plurality of second touch electrodes; a plurality of first pen electrodes, each of which is disposed between a corresponding one among the plurality of first sensor parts and a corresponding one among the plurality of second sensor parts; and a plurality of second pen electrodes, each of which is disposed between a corresponding one among the plurality of third sensor parts and a corresponding one among the plurality of fourth sensor parts; wherein: the plurality of first pen electrodes are electrically connected to each other by two; the plurality of second pen electrodes are electrically connected to each other by two; the plurality of first touch electrodes and the plurality of second touch electrodes are configured to sense a touch input during a touch sensing mode; and the plurality of first pen electrodes and the plurality of second pen electrodes are configured to sense a pen input during a pen sensing mode.

The plurality of first connection parts and the plurality of second connection parts may be formed from a first conductive layer; the plurality of first to fourth sensor parts, the plurality of first pen electrodes and the plurality of second pen electrodes may be formed from a second conductive layer; and an insulation layer may be disposed between the first conductive layer and the second conductive layer.

The plurality of second touch electrodes may extend in a first direction and may be arranged in a second direction crossing the first direction; the plurality of first touch electrodes may extend in the second direction and may be arranged in the first direction; the plurality of first sensor parts and the plurality of second sensor parts may be spaced apart from each other in the second direction; and the plurality of third sensor parts and the plurality of fourth sensor parts may be spaced part from each other in the first direction.

The plurality of first touch electrodes and the plurality of second touch electrodes may be insulated from each other, and the plurality of first pen electrodes and the plurality of second pen electrodes may be insulated from each other.

Each of the plurality of first pen electrodes may include a plurality of third sensing lines; and each of the plurality of second pen electrodes may include a plurality of fourth sensing lines.

One ends of the two of the plurality of third sensing lines may be electrically connected to each other; and one ends of the two of the plurality of fourth sensing lines may be electrically connected to each other.

According to some aspects of the invention, a display device includes: a display panel; an input sensor disposed on a first surface of the display panel; and a sensing circuit configured to receive first input information and second input information from the input sensor, wherein the input sensor includes: a plurality of first sensing electrodes, each of which has a plurality of first sensor parts, a plurality of second sensor parts and a plurality of first connection parts; a plurality of second sensing electrodes insulated from the plurality of first sensing electrodes, each of the plurality of second sensing electrodes having a plurality of third sensor parts, a plurality of fourth sensor parts and a plurality of second connection parts; a plurality of first sensing lines, each of which is electrically connected to a corresponding one of the plurality of first sensing electrodes; a plurality of second sensing lines, each of which is electrically connected to a corresponding one of the plurality of second sensing electrodes; a plurality of third sensing electrodes, each of which is disposed between a corresponding one among the plurality of first sensor parts and a corresponding one among the plurality of second sensor parts; and a plurality of fourth sensing electrodes, each of which is disposed between a corresponding one among the plurality of third sensor parts and a corresponding one among the plurality of fourth sensor parts, wherein two of the plurality of third sensing electrodes are electrically connected to each other; and two of the plurality of fourth sensing electrodes are electrically connected to each other, wherein the sensing circuit is further configured to: receive the first input information through the plurality of first sensing lines and the plurality of second sensing lines in a first sensing mode; and receive the second input information through the plurality of first sensing lines and the plurality of second sensing lines in a second sensing mode.

The plurality of first connection parts and the plurality of second connection parts may be formed from a first conductive layer; the plurality of first to fourth sensor parts, the plurality of third sensing electrodes and the plurality of fourth sensing electrodes may be formed from a second conductive layer; and an insulation layer may be disposed between the first conductive layer and the second conductive layer.

The plurality of second sensing electrodes may extend in a first direction and may be arranged in a second direction intersecting the first direction; the plurality of first sensing electrodes may extend in the second direction and may be arranged in the first direction; the plurality of first sensor parts and the plurality of second sensor parts may be spaced apart from each other in the second direction; and the plurality of third sensor parts and the plurality of fourth sensor parts may be spaced part from each other in the first direction.

The plurality of first sensing electrodes and the plurality of second sensing electrodes may be insulated from each other, and the third sensing electrodes and the plurality of fourth sensing electrodes may be insulated from the plurality of first sensing electrodes and the plurality of second sensing electrodes.

The plurality of third sensing electrodes may include a plurality of third sensing lines; and the plurality of fourth sensing electrodes may include a plurality of fourth sensing lines.//The sensing circuit may receive a touch input information through the plurality of first sensing lines and the plurality of second sensing lines in the first sensing mode; and the sensing circuit may receive a pen input information through the plurality of third sensing lines and the plurality of fourth sensing lines in the second sensing mode.

One ends of the two of the plurality of third sensing lines may be electrically connected to each other; and one ends of the two of the plurality of fourth sensing lines may be electrically connected to each other.

According to some aspects of the invention, a display device includes a plurality of first electrodes, wherein at least one of the plurality of first electrodes comprises a first sensor part and a second sensor part, a plurality of second electrodes insulated from the plurality of first electrodes, wherein at least one of the plurality of second electrodes comprises a third sensor part and a fourth sensor part, a first sensing line electrically connected to one of the plurality of first electrodes, a plurality of second sensing lines electrically connected to one of the plurality of second electrodes, a plurality of third electrodes, wherein at least one of the plurality of third electrodes is disposed between the first sensor part and the second sensor part, and a plurality of fourth electrodes, wherein at least one of the plurality of fourth electrodes is disposed between the third sensor part and the fourth sensor part, wherein at least two third electrodes among the plurality of third electrodes are electrically connected to each other and at least two fourth electrodes among the plurality of fourth electrodes are electrically connected to each other.

Each of the plurality of first electrodes may include a first connection part electrically connecting the first sensor part and the second sensor part, and each of the plurality of second electrodes may include a second connection part electrically connecting the third sensor part and the fourth sensor part.

The first connection part and the second connection part may be formed from a first conductive layer, the first to fourth sensor part, the plurality of third sensing electrodes and the plurality of fourth sensing electrodes may be formed from a second conductive layer; and an insulation layer may be disposed between the first conductive layer and the second conductive layer.

The plurality of second electrodes may extend in a first direction and may be arranged in a second direction intersecting the first direction, the plurality of first electrodes may extend in the second direction and may be arranged in the first direction, the first sensor part and the second sensor part may be spaced apart from each other in the second direction, and the plurality of third sensor parts and the plurality of fourth sensor parts may be spaced part from each other in the first direction.

The plurality of first electrodes and the plurality of second electrodes may be configured to sense a touch input during a first sensing mode, and the plurality of third electrodes and the plurality of fourth electrodes may be configured to sense a pen input during a second sensing mode.

The plurality of third electrodes may include a plurality of third sensing lines; and the plurality of fourth electrodes may include a plurality of fourth sensing lines.

At least two third sensing lines among the plurality of third sensing lines may be electrically connected to each other, and at least two fourth sensing lines among the plurality of fourth sensing lines may be electrically connected to each other.

According to some aspects of the invention, an input sensor may include a plurality of first touch electrodes, wherein at least one of the plurality of first touch electrodes may include a first sensor part and a second sensor part, a plurality of second touch electrodes insulated from the plurality of first touch electrodes, each of the plurality of second touch electrodes may have a third sensor part and a fourth sensor part, a plurality of first pen electrodes, wherein at least one of the plurality of first pen electrodes may be disposed between the first sensor part and the second sensor part, and a plurality of second pen electrodes, wherein at least one of the plurality of second pen electrodes may be disposed between the third sensor part and the fourth sensor part, wherein at least two of the plurality of first pen electrodes may be electrically connected to each other, at least two of the plurality of second pen electrodes may be electrically connected to each other, the plurality of first touch electrodes and the plurality of second touch electrodes may be configured to sense a touch input during a touch sensing mode, and the plurality of first pen electrodes and the plurality of second pen electrodes may be configured to sense a pen input during a pen sensing mode.

Each of the plurality of first touch electrodes may include a first connection part electrically connecting the first sensor part and the second sensor part, and each of the plurality of second touch electrodes may include a second connection part electrically connecting the third sensor part and the fourth sensor part.

The first connection part and the second connection part may be formed from a first conductive layer, the first to fourth sensor parts, the plurality of first pen electrodes and the plurality of second pen electrodes may be formed from a second conductive layer, and an insulation layer may be disposed between the first conductive layer and the second conductive layer.

The plurality of second touch electrodes may extend in a first direction and may be arranged in a second direction intersecting the first direction, the plurality of first touch electrodes may extend in the second direction and may be arranged in the first direction, the first sensor part and the second sensor part may be spaced apart from each other in the second direction, and the third sensor part and the fourth sensor part may be spaced part from each other in the first direction.

The plurality of first pen electrodes may include a plurality of first sensing lines; and the plurality of second pen electrodes may include a plurality of second sensing lines.

At least two first sensing lines among the plurality of first sensing lines may be electrically connected to each other, and at least two second sensing lines among the plurality of second sensing lines may be electrically connected to each other.

According to some aspects of the inventions, a display device includes a display panel, an input sensor disposed on a first surface of the display panel, and a sensing circuit configured to receive first input information and second input information from the input sensor, wherein the input sensor includes a plurality of first electrodes, wherein at least one of the plurality of first electrodes includes a first sensor part and a second sensor part, a plurality of second electrodes insulated from the plurality of first electrodes, wherein at least one of the plurality of second electrodes includes a third sensor part and a fourth sensor part, a plurality of first sensing lines electrically connected to each of the plurality of first electrodes, a plurality of second sensing lines electrically connected to each of the plurality of second electrodes, a plurality of third electrodes, wherein at least one of the plurality of third electrodes is disposed between the first sensor part and the second sensor part, and a plurality of fourth electrodes, wherein at least one of the plurality of fourth electrodes is disposed between the third sensor part and the fourth sensor part, wherein at least two third electrodes among the plurality of third electrodes are electrically connected to each other and at least two fourth electrodes among the plurality of fourth electrodes are electrically connected to each other.

Each of the plurality of first electrodes may include a first connection part electrically connecting the first sensor part and the second sensor part, and each of the plurality of second electrodes may include a second connection part electrically connecting the third sensor part and the fourth sensor part.

The plurality of second electrodes may extend in a first direction and may be arranged in a second direction intersecting the first direction, the plurality of first electrodes may extend in the second direction and may be arranged in the first direction, the plurality of first sensor parts and the plurality of second sensor parts may be spaced apart from each other in the second direction, and the plurality of third sensor parts and the plurality of fourth sensor parts may be spaced part from each other in the first direction.

The sensing circuit may be further configured to receive the first input information through the plurality of first sensing lines and the plurality of second sensing lines during a first sensing mode, and receive the second input information through the plurality of third electrodes and the plurality of fourth electrodes during a second sensing mode.

The plurality of third electrodes may include a plurality of third sensing lines, and the plurality of fourth electrodes may include a plurality of fourth sensing lines.

The sensing circuit may receive a touch input information through the plurality of first sensing lines and the plurality of second sensing lines during the first sensing mode, and the sensing circuit may receive a pen input information through the plurality of third sensing lines and the plurality of fourth sensing lines during the second sensing mode.

At least two third sensing lines among the plurality of third sensing lines may be electrically connected to each other, and at least two fourth sensing lines among the plurality of fourth sensing lines may be electrically connected to each other.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1:
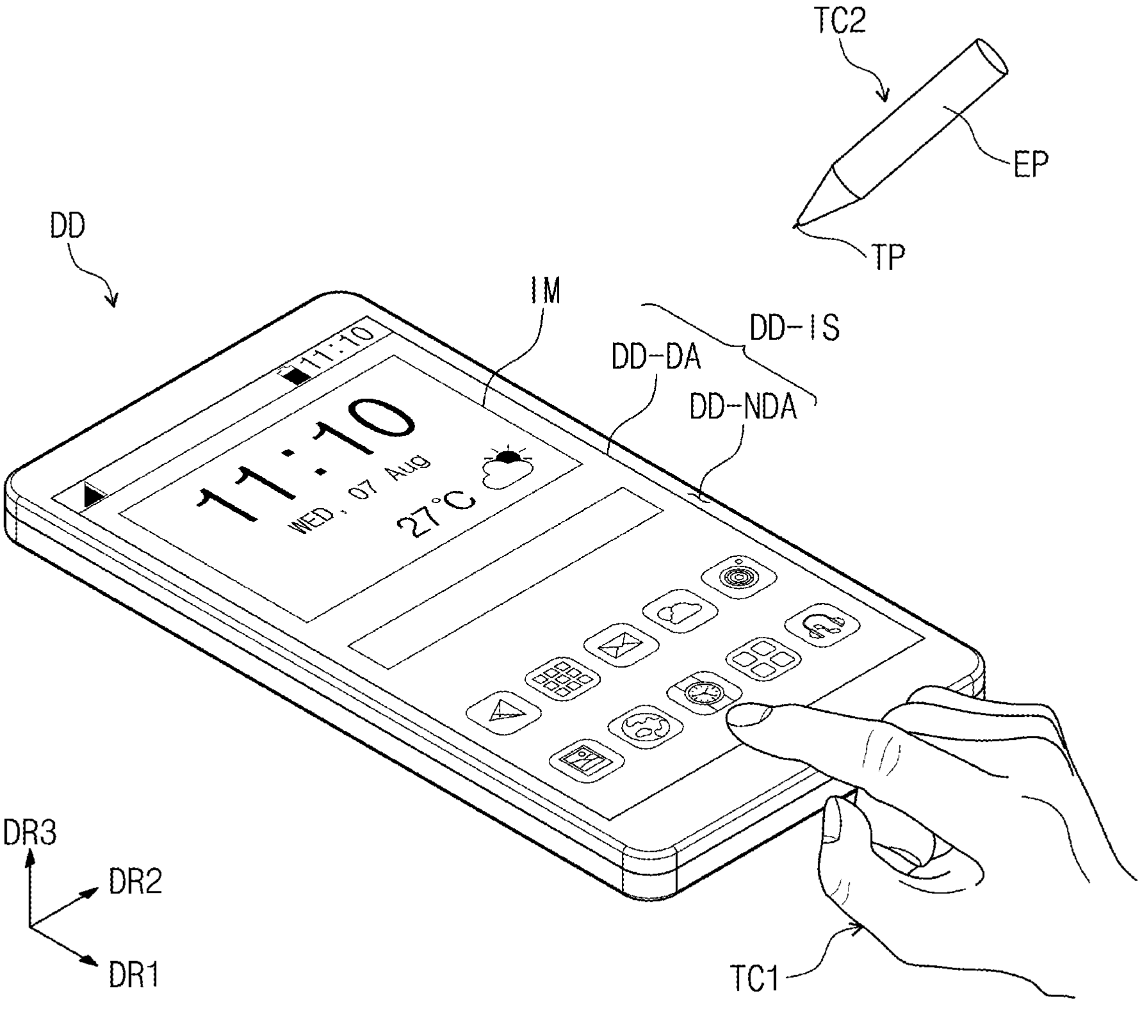
FIG. 1 is a perspective view of a display device according to some embodiments.

In the following description, for the purposes of explanation, numerous specific details are set forth in order to provide a thorough understanding of various embodiments. As used herein, the terms "embodiments" and "implementations" are used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

Figure 2:
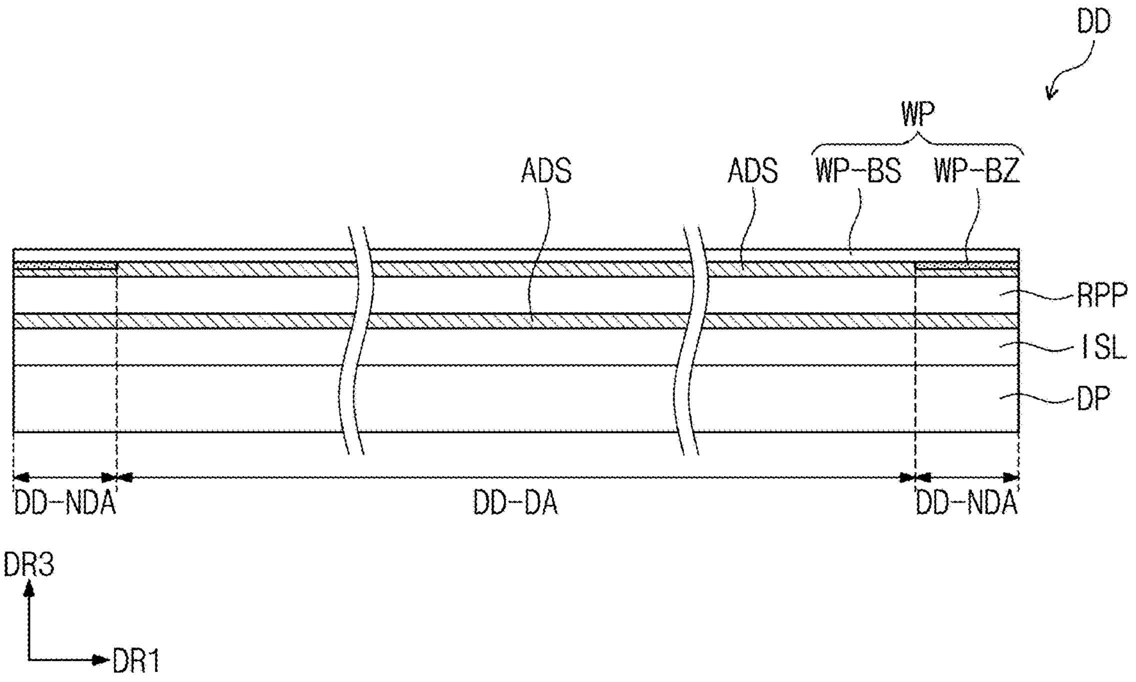
FIG. 2 is a cross-sectional view of the display device of FIG. 1 according to some embodiments.

FIG. 1 is a perspective view of a display device DD according to some embodiments. FIG. 2 is a cross-sectional view of the display device DD according to some embodiments.

Referring to FIG. 1, the display device DD may display an image IM through a display surface DD-IS. The display surface DD-IS is parallel to a surface defined by a first directional axis DR1 and a second directional axis DR2. A normal direction of the display surface DD-IS, e.g., a thickness direction of the display device DD is indicated as a third directional axis DR3.

A front surface (or a top surface) and a rear surface (or a bottom surface) of each of layers, members, units, or other elements, which will be described below, are distinguished by the third directional axis DR3. However, the first to third directional axes DR1 to DR3 illustrated in, for example, FIG. 1 may be merely examples. Hereinafter, first to third directions may be directions indicated by the first to third directional axes DR1, DR2, and DR3 and designated by the same reference numerals, respectively.

Although the display device DD having a planar display surface is illustrated as an embodiment, embodiments are not limited thereto. The display device DD may additionally or alternatively include a curved display surface. The display device DD may include a solid display surface. The solid display surface may include a plurality of display areas that indicate different directions. For example, the solid display surface may include a polygonal column-type display surface.

The display device DD according to some embodiments may be a rigid display device. However, embodiments are not limited thereto. For example, the display DD may be a flexible display device or a hybrid display device including at least one rigid portion and at least one flexible portion. The flexible display device may include a foldable-type display device or a bending-type display device of which a portion is bent.

For convenience, the display device DD is capable of being applied to a mobile terminal is exemplarily illustrated and described in association with FIG. 1. According to various embodiments, electronic modules, a camera module, a power module, and/or the like, which may be mounted on a main board, may be disposed on a bracket/case together with the display device DD to constitute the mobile terminal. The display device DD according to some embodiments may be applied to large-sized electronic apparatuses, such as televisions, monitors, etc., and small and/or mid-sized electronic apparatuses, such as tablet personal computers, navigation units for vehicles, game consoles, smart watches, etc.

As illustrated in FIG. 1, the display surface DD-IS includes an image area DD-DA on (or in) which an image IM is displayed, and a bezel area DD-NDA adjacent to the image area DD-DA. The bezel area DD-NDA may be an area on which an image is not displayed. FIG. 1 at least illustrates an icon as an example of the image IM.

As illustrated in FIG. 1, the image area DD-DA may have a substantially rectangular shape. The "substantially rectangular shape" includes not only a rectangular shape in a mathematical sense, but also a rectangular shape in which a vertex is not defined in a vertex area (or a corner area), but a boundary of a curve is defined. It, however, is contemplated that any other suitable shape may be utilized.

The bezel area DD-NDA may surround the image area DD-DA. However, embodiments are not limited thereto. For example, the image area DD-DA and the bezel area DD-NDA may be designed in different shapes. The bezel area DD-NDA may be disposed on only one side of the image area DD-DA. The bezel area DD-NDA may not be exposed to the outside according to coupled configurations of the display device DD and other components of an electronic device including the display device DD.

The display device DD according to some embodiments may sense a first input TC of a user that is applied from the outside. The first input TC1 of the user may be one or a combination of various types of external inputs, such as at least one of a portion of the user's body, light, heat, and a pressure. For convenience, it will be assumed that the first input TC1 of the user is a touch input by a user's hand applied to the front surface, but this is merely illustrative, and thus, as described above, the first input TC1 may be provided in various forms to one or more surfaces of the display device DD. For instance, the display device DD may sense the first input TC1 of the user that is applied to a side or rear surface of the display device DD, according to a structure of the display device DD, but is not limited to a specific embodiment.

Also, the display device DD according to some embodiments may sense a second input TC2 applied from the outside. The second input TC2 includes inputs by, for instance, an electronic input device (e.g., stylus pen, touch pen, electronic pen, e-pen, etc.) in addition to the user's hand. In the following description, it will be assumed that the second input TC2 is an input by an electronic pen EP. The electronic pen EP includes a tip TP (or other portion) made of a conductive material. The display device DD senses an electromagnetic resonance (EMR) due to electromagnetic induction generated between internally generated magnetic fields and the tip TP of the electronic pen EP to sense the second input TC2.

FIG. 2 illustrates a cross-section defined by the first directional axis DR1 and the third directional axis DR3. In FIG. 2, the components of the display device DD are simply (or generally) illustrated to explain their lamination relationship.

The display device DD according to some embodiments may include a display panel DP, an input sensor ISL, an anti-reflector RPP, and a window WP. The components of at least some of the display panel DP, the input sensor ISL, the anti-reflector RPP, and the window WP may be formed through a continuous process without an adhesive member, or the components of at least some may be coupled to each other through an adhesive member, such as adhesive member ADS. The adhesive member ADS may be a transparent adhesive member, such as a pressure sensitive adhesive film (PSA), an optically clear adhesive film (OCA), and/or an optically clear resin (OCR). The adhesive member ADS described below may include a conventional adhesive or an adhesive agent. In one embodiment, the anti-reflector RPP and the window WP may be replaced by other components or omitted.

In FIG. 2, the input sensor ISL formed together with the display panel DP among the input sensor ISL, the anti-reflector RPP, and the window WP through the continuous process is directly disposed on the display panel DP. For the purposes of this disclosure, that "a component B is disposed directly on a component A" means that no separate adhesive layer/adhesive member is disposed between the component A and the component B. As such, the component B is formed through a continuous process on a base surface provided by the component A, such as after the component A is formed.

In an embodiment, each of the anti-reflector RPP and the window WP is provided as a "panel" type, and the input sensor ISL is provided as a "layer" type. The "panel" type includes a base layer that provides a base surface, for example, a synthetic resin film, a composite film, a glass substrate, and/or the like, but the base layer may be omitted in the "layer" type. That is to say, the components of the "layer" type are disposed on the base surface provided by another component. The "layer" type may also be referred to as a "film" type. In an embodiment, the anti-reflector RPP and the window WP may be provided as the "layer" type.

The display panel DP generates an image, and the input sensor ISL obtains coordinate information of an external input (e.g., a touch event). The display device DD according to some embodiments may further include a protection member disposed on a bottom surface of the display panel DP. The protection member and the display panel DP may be coupled to each other through an adhesive member.

The display panel DP according to some embodiments may be an emission type display panel, but is not limited thereto. For example, the display panel DP may be an organic light emitting display panel, a quantum dot light emitting display panel, an inorganic light emitting display panel, etc. The panels are classified according to a material of the light emitting device. A light emitting layer of the organic light emitting display panel may include an organic light emitting material. A light emitting layer of the quantum dot light emitting display panel may include a quantum dot and/or a quantum rod. A light emitting layer of the inorganic light emitting display panel may include an inorganic light emitting material. Hereinafter, the display panel DP will be described as an organic light emitting display panel.

The anti-reflector RPP reduces reflectance of external light incident from an upper side of the window WP. The anti-reflector RPP according to some embodiments may include a phase retarder and a polarizer. The phase retarder may be a film type or a liquid crystal coating type, and may include a A/2 phase retarder and/or a $\lambda/4$ phase retarder. The polarizer may also be a film type or liquid crystal coating type polarizer. The film type may include an elongation-type synthetic resin, and the liquid crystal coating type may include liquid crystals that are arranged in a predetermined arrangement. Each of the phase retarder and the polarizer may further include a protection film. The phase retarder and polarizer itself or the protection film may be defined as the base layer of the anti-reflector RPP.

The anti-reflector RPP according to some embodiments may include color filters. The color filters may have a predetermined arrangement. The arrangement of the color filters may be determined in consideration of emission colors of the pixels provided in the display panel DP. The anti-reflector RPP may further include a black matrix adjacent to the color filters.

The anti-reflector RPP according to some embodiments may include a destructive interference structure. For example, the destructive interference structure may include a first reflection layer and a second reflection layer that are disposed on layers different from each other. First reflected light and second reflected light, which are respectively reflected by the first reflection layer and the second reflection layer, may destructively interfere with each other to reduce the reflectance of the external light.

The window WP according to some embodiments includes a base layer WP-BS and a light blocking pattern WP-BZ. The base layer WP-BS may include a glass substrate and/or a synthetic resin film. The base layer WP-BS is not limited to a single layer. The base layer WP-BS may include two or more films bonded by the adhesive member.

The light blocking pattern WP-BZ partially overlaps the base layer WP-BS. The light blocking pattern WP-BZ may be disposed on a rear surface of the base layer WP-BS, and the light blocking pattern WP-BZ may substantially define the bezel area DD-NDA of the display device DD. An area on which the light blocking pattern WP-BZ is not disposed may define the image area DD-DA of the display device DD. When limited to the window WP, an area on which the light blocking pattern WP-BZ is disposed is defined as a light blocking area of the window WP, and an area on which the light blocking pattern WP-BZ is not disposed is defined as a transmission area of the window WP.

The light blocking pattern WP-BZ may have a multi-layered structure. The multi-layered structure may include a chromatic color layer and an achromatic (e.g., black color) light blocking layer. The chromatic color layer and the achromatic black light blocking layer may be formed through at least one of deposition, printing, and coating processes. The window WP may further include a functional coating layer disposed on an entire surface of the base layer WP-BS. The functional coating layer may include at least one of an anti-fingerprint layer, an anti-reflection layer, a hard coating layer, and the like.

Figure 3:
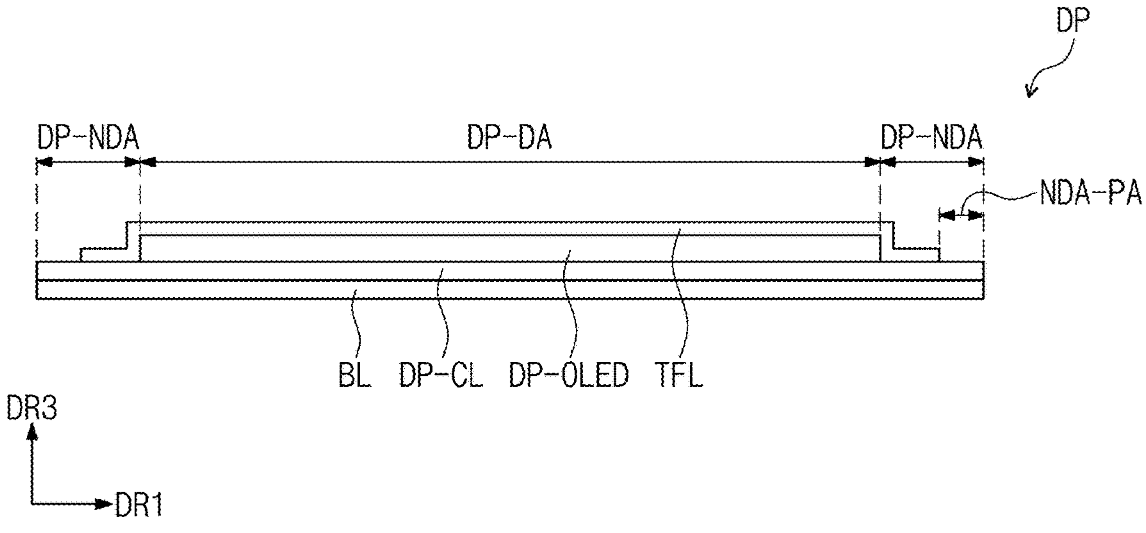
FIG. 3 is a cross-sectional view of a display panel according to some embodiments.
Figure 4:
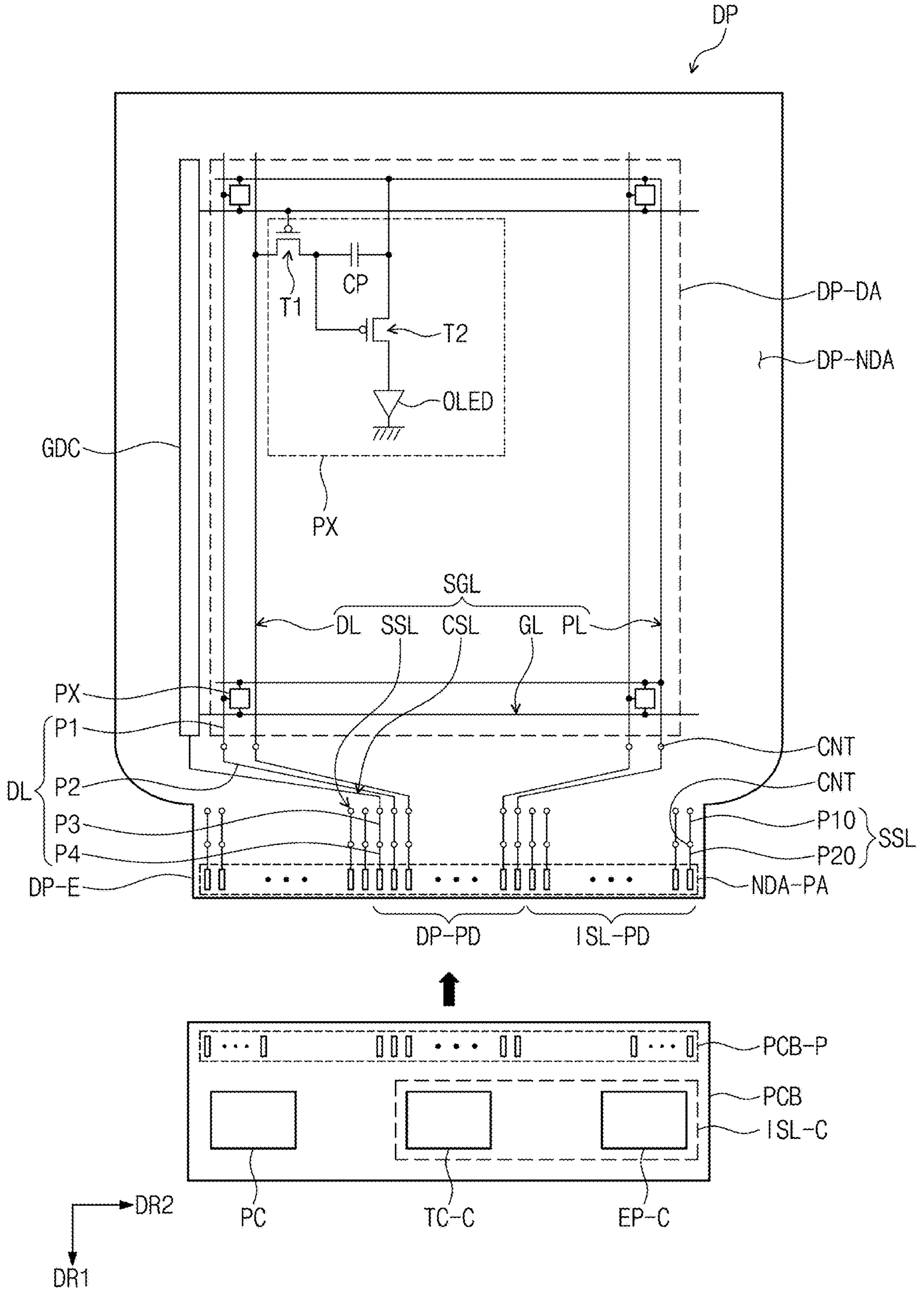
FIG. 4 is a plan view of the display panel of FIG. 3 according to some embodiments.

FIG. 3 is a cross-sectional view of the display panel DP according to some embodiments. FIG. 4 is a plan view of the display panel DP according to some embodiments.

As illustrated in FIG. 3, the display panel DP may include a base layer BL, a circuit element layer DP-CL disposed on the base layer BL, a display element layer DP-OLED, and an upper insulation layer TFL. A display area DP-DA and a non-display area DP-NDA, which correspond to the image area DD-DA and the bezel area DD-NDA of FIG. 1, may be defined. For the purposes of this disclosure, that a "region/portion and/or area/portion corresponds to each other" means "overlap each other," but is not limited to having the same area and/or the same shape.

The base layer BL may include at least one synthetic resin film. The base layer BL may include a at least one of a glass substrate, a metal substrate, and an organic/inorganic composite substrate.

The circuit element layer DP-CL includes at least one insulation layer and at least one circuit element. The insulation layer includes at least one inorganic layer and at least one organic layer. The circuit element includes signal lines, a pixel driving circuit, and the like.

The display element layer DP-OLED may include at least one organic light emitting diode as a light emitting element. The display element layer DP-OLED may further include an organic layer, such as a pixel defining layer.

The upper insulation layer TFL may include a plurality of thin films. One portion of the thin films may be disposed to improve optical efficiency, and the one portion of the thin film may be disposed to protect the organic light emitting diodes. The upper insulation layer TFL will be described later in more detail.

As illustrated in FIG. 4, the display panel DP includes a driving circuit GDC, a plurality of signal lines SGL (hereinafter, referred to as signal lines), a plurality of signal pads DP-PD, ISL-PD (hereinafter, referred to as signal pads), and a plurality of pixels PX (hereinafter, referred to as pixels).

The driving circuit GDC may include a scan driving circuit. The scan driving circuit generates a plurality of scan signals (hereinafter, referred to as scan signals) to sequentially output the scan signals to a plurality of scan lines GL (hereinafter, referred to as scan lines) that will be described later. The scan driving circuit may further output another control signal to the driving circuit of the pixels PX.

The scan driving circuit may include a plurality of transistors that are manufactured through the same process(es) as the driving circuit of the pixel PX, e.g., at least one of a low temperature polycrystalline silicon (LTPS) process and a low temperature polycrystalline oxide (LTPO) process.

The signal lines SGL include scan lines GL, data lines DL, a power line PL, and a control signal line CSL. The scan lines GL are respectively connected to corresponding pixels PX of the pixels PX, and the data lines DL are respectively connected to corresponding pixels PX of the pixels PX. The power line PL is connected to the pixels PX. The control signal line CSL may provide control signals to the scan driving circuit.

In an embodiment, the signal lines SGL may further include auxiliary lines SSL. The auxiliary lines SSL are signal lines connected to the input sensor ISL (see FIG. 2). In an embodiment, the auxiliary lines SSL may be omitted.

The signal lines SGL may include a plurality of portions disposed on different layers. FIG. 4 illustrates an example of the auxiliary lines SSL that includes the data lines DL including four portions P1 to P4 and the auxiliary lines SSL including two portions P10 to P20. The four portions P1 to P4 may be connected through contact holes CNT, and the two portions P10 and P20 may be connected through the contact holes CNT. The first portion P10 of the auxiliary lines SSL is connected to the signal line(s) of the input sensor layer ISL (see FIG. 6B), which will be described below, through the contact holes CNT.

The signal pads DP-PD and ISL-PD may include first type signal pads DP-PD connected to the data lines DL, the power line PL, and the control signal line CSL, and include second type signal pads ISL-PD connected to the auxiliary lines SSL. The first type signal pads DP-PD and the second type signal pads ISL-PD are disposed adjacent to each other on a pad area NDA-PA defined on a portion of the non-display area DP-NDA. The pad area NDA-PA may be adjacent to an edge DP-E of the display panel DP. The signal pads DP-PD and ISL-PD may be formed through the same process(es) without distinguishing lamination structures or constituent materials from each other.

The display area DP-DA may be defined as an area on which the pixels PX are disposed. A plurality of electronic elements may be disposed on the display area DP-DA. The electronic elements include an organic light emitting diode OLED provided in each of the pixels PX and a pixel driving circuit connected to the organic light emitting diode OLED. The driving circuit GDC, the signal lines SGL, the signal pads DP-PD and ISL-PD, and the pixel driving circuit may be provided in the circuit element layer DP-CL illustrated in FIG. 3.

For example, the pixel PX may include a first transistor T1, a second transistor T2, a capacitor CP, and an organic light emitting diode OLED. The pixel driving circuit is sufficient to include a switching transistor and a driving transistor, but is not limited to the embodiment shown in FIG. 4. The first transistor T1 is connected to the scan line SL and the data line DL. The organic light emitting diode OLED receives a power voltage provided from the power line PL.

In FIG. 4, a circuit board PCB electrically connected to the display panel DP is additionally illustrated. The circuit board PCB may be a rigid circuit board or a flexible circuit board.

A panel control circuit PC that controls an operation of the display panel DP may be disposed on the circuit board PCB. Also, an input sensing circuit ISL-C that controls the input sensor ISL may be disposed on the circuit board PCB. Each of the panel control circuit PC and the input sensing circuit ISL-C may be mounted on the circuit board PCB in the form of integrated chips, but embodiments are not limited thereto. In another embodiment, the panel control circuit PC and the input sensing circuit ISL-C may be mounted on the circuit board PCB in the form of one integrated chip. The input sensing circuit ISL-C may include a first sensing circuit TC-C for sensing the first input TC1 of the user, which is illustrated in FIG. 1, and a second sensing circuit EP-C for sensing the second input TC2 by the electronic pen EP. The first sensing circuit TC-C and the second sensing circuit EP-C may be mounted on the circuit board PCB in the form of one integrated chip like the input sensing circuit ISL-C. In another embodiment, each of the first sensing circuit TC-C and the second sensing circuit EP-C may be mounted on the circuit board PCB in the form of a separate integrated chip. The circuit board PCB may include circuit board pads PCB-P electrically connected to the signal pads DP-PD and ISL-PD. The circuit board PCB may further include signal lines connecting the circuit board pads PCB-P to the panel control circuit PC and/or the input sensing circuit ISL-C. Also, the circuit board pads PCB-P may include at least one output pad and at least one input pad.

The signal pads DP-PD and ISL-PD of the display panel DP and the circuit board pads PCB-P may be directly connected to each other. In another embodiment, the signal pads DP-PD and ISL-PD and the circuit board pads PCB-P may be electrically connected to each other through a connecting substrate, such as an anisotropic conductive film.

In another embodiment, the panel control circuit PC may be mounted on the non-display area DP-NDA of the display panel DP instead of the circuit board PCB.

A portion of the display panel DP illustrated in FIG. 4 may be bent. A portion of the non-display area DP-NDA may be bent with respect to a bending axis parallel to a second direction DR2, but embodiments are not limited thereto. In some embodiments, the bending axis may be defined to overlap the third portions P3 of the data lines DL and the first portion P10 of the auxiliary lines SSL.

Figure 5A:
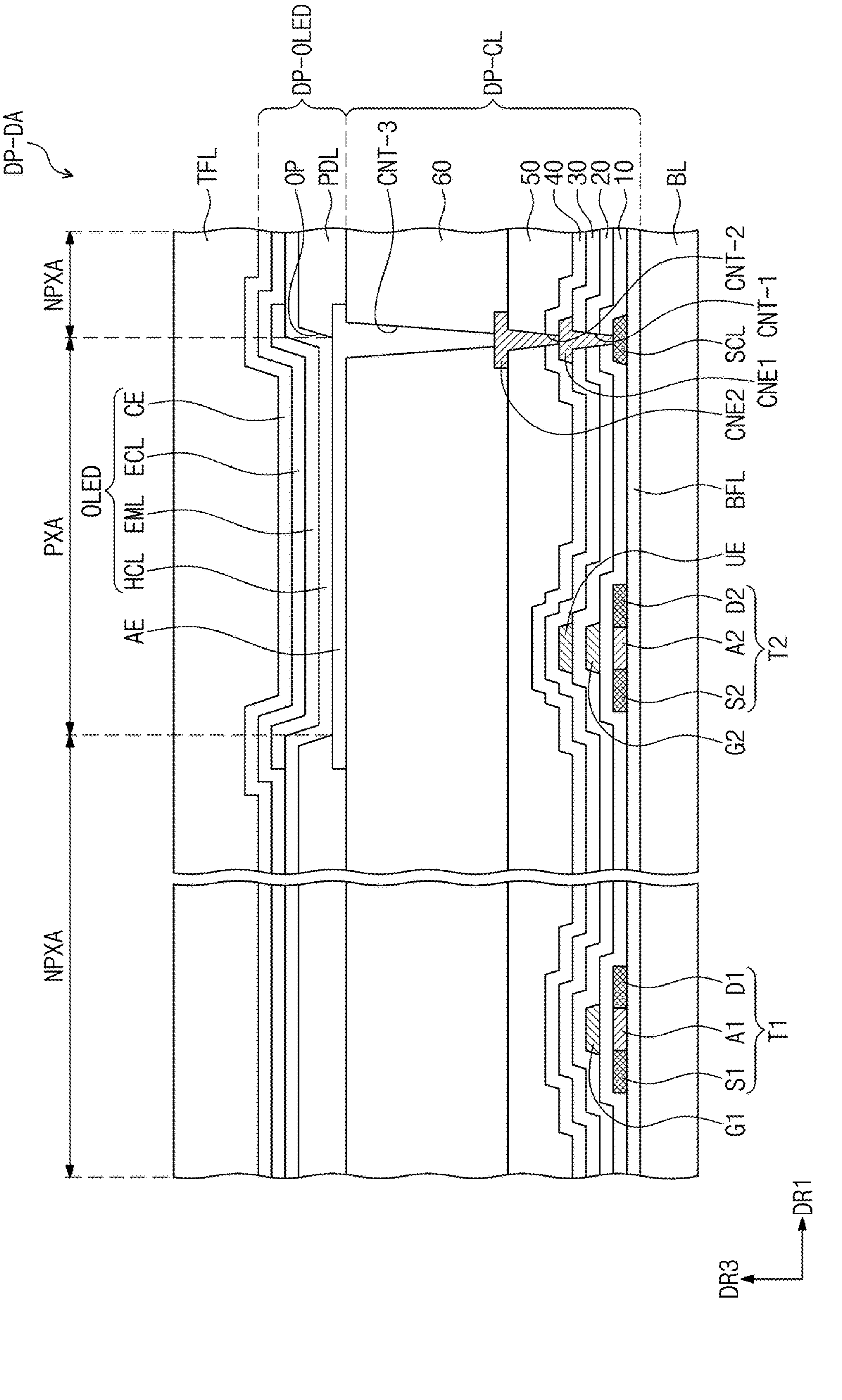
FIG. 5A is an enlarged cross-sectional view of the display panel of FIG. 3 according to some embodiments.
Figure 5B:
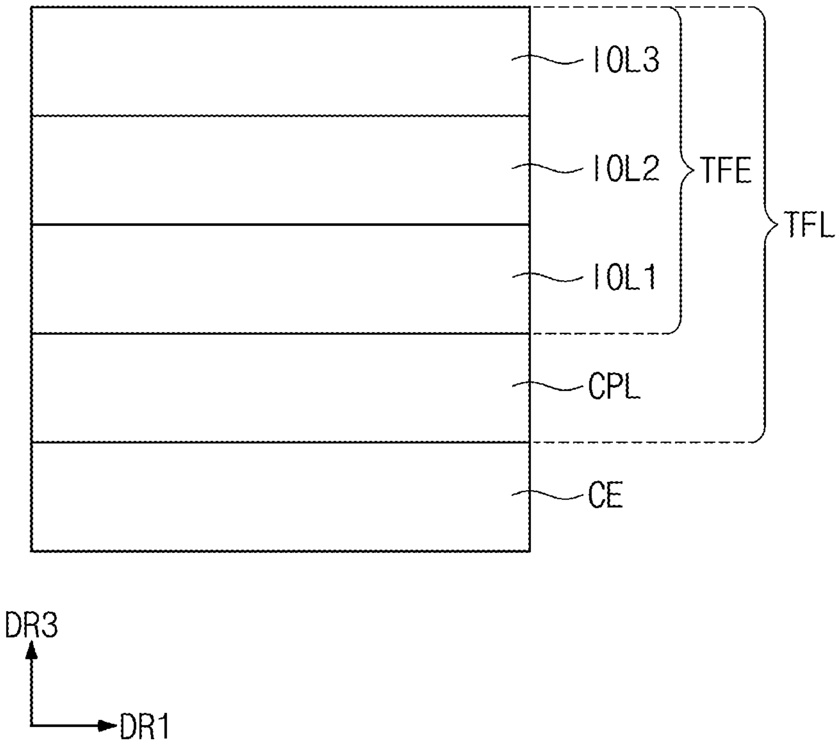
FIG. 5B is an enlarged cross-sectional view of an upper insulation layer according to some embodiments.

FIG. 5A is an enlarged cross-sectional view of the display panel DP according to some embodiments. FIG. 5B is an enlarged cross-sectional view of an upper insulation layer TFL according to some embodiments.

Referring to FIG. 5A, the display panel DP may include a plurality of insulation layers, a semiconductor pattern, a conductive pattern, a signal line, and the like. The insulation layer, the semiconductor layer, and the conductive layer may be formed through methods, such as coating, deposition, and the like. Thereafter, the insulation layer, the semiconductor layer, and the conductive layer may be selectively patterned in a photolithography manner. The semiconductor pattern, the conductive pattern, and the signal line that are provided in the circuit element layer DP-CL and the display element layer DP-OLED may be formed in the above-described manner.

The base layer BL may include a synthetic resin film. The synthetic resin layer may include a thermosetting resin. The base layer BL may have a multi-layered structure. For example, the base layer BL may have a three-layer structure of a synthetic resin layer, an adhesive layer, and a synthetic resin layer. For example, the synthetic resin layer may be a polyimide resin layer, and the material thereof is not particularly limited. For instance, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. In addition, the synthetic resin layer may include at least one of a glass substrate, a metal substrate, and an organic/inorganic composite substrate.

At least one inorganic layer may be disposed on a top surface of the base layer BL. The inorganic layer may include at least one of oxide, titanium oxide, silicon oxide, silicon oxide nitride, zirconium oxide, and hafnium oxide. The inorganic layer may be provided as a multilayer structure. The multi-layered inorganic layer may constitute a barrier layer and/or a buffer layer. As seen in FIG. 5A, the display panel DP is shown as including a buffer layer BFL.

The buffer layer BFL may improve bonding force between the base layer BL and the semiconductor pattern. The buffer layer BFL may include at least one of a silicon oxide layer and a silicon nitride layer. In some implementations, the silicon oxide layer and the silicon nitride layer may be alternately laminated.

The semiconductor pattern is disposed on the buffer layer BFL. The semiconductor pattern may include polysilicon. However, embodiments are not limited thereto. For example, the semiconductor pattern may include amorphous silicon or metal oxide.

FIG. 5A illustrates merely a portion of the semiconductor pattern. For example, the semiconductor pattern may be further disposed on other areas of the pixel PX on the plane. The semiconductor pattern may be arranged in a determined pattern in the pixels PX. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped, and an N-type transistor includes a doped region into which the N-type dopant is doped.

The doped region may have conductivity greater than that of the non-doped region and substantially act as an electrode or a signal line. The non-doped region may substantially correspond to an active portion (or a channel) of the transistor. That is to say, a portion of the semiconductor pattern may be an active portion of the transistor, another portion may be a source or drain of the transistor, and yet another portion may be a connection electrode or a connection signal line.

As illustrated in FIG. 5A, a source portion S1, an active portion A1, and a drain portion D1 of a first transistor T1 may be formed from the semiconductor pattern, and a source portion S2, an active portion A2, and a drain portion D2 of the second transistor T2 may be formed from the semiconductor pattern. The source portions S1 and S2 and the drain portions D1 and D2 extend from the active portions A1 and A2 in directions opposite to each other. FIG. 5A illustrates a portion of the connection signal line SCL formed from the semiconductor pattern. The connection signal line SCL may be connected to the drain portion D2 of the second transistor T2 on the plane.

A first insulation layer 10 is disposed on the buffer layer BFL. The first insulation layer 10 commonly overlaps the plurality of pixels PX (see FIGS. 4 and 5A) and covers the semiconductor pattern. The first insulation layer 10 may include an inorganic layer and/or an organic layer, and may have a single-layered or multi-layered structure. The first insulation layer 10 may include at least one of oxide, titanium oxide, silicon oxide, silicon oxide nitride, zirconium oxide, and hafnium oxide. In one embodiment, the first insulation layer 10 may include a single-layered silicon oxide layer. The insulation layer of the circuit element layer DP-CL, which will be described later, as well as the first insulation layer 10 may be an inorganic layer and/or an organic layer, and may have a single-layered or a multi-layered structure. The inorganic layer may include at least one of the above-described materials.

Gates G1 and G2 are disposed on the first insulation layer 10. Each of the gates G1 and G2 may be a portion of the metal pattern. The gates G1 and G2 overlap the active portions A1 and A2. In a process of doping the semiconductor pattern, the gates G1 and G2 may serve as masks.

A second insulation layer 20 covering the gates G1 and G2 is disposed on the first insulation layer 10. The second insulation layer 20 commonly overlaps the pixels PX (see FIGS. 4 and 5A). The second insulation layer 20 may include an inorganic layer and/or an organic layer, and may have a single-layered or multi-layered structure. In an embodiment, the second insulation layer 20 may include a single-layered silicon oxide layer.

An upper electrode UE may be disposed on the second insulation layer 20. The upper electrode UE may overlap the gate G2 of the second transistor T2. The upper electrode UE may be a portion of the metal pattern. A portion of the gate G2 and the upper electrode UE overlapping the portion of the gate G2 may define a capacitor CP (see FIG. 4). In an embodiment, the upper electrode UE may be omitted.

A third insulation layer 30 covering the upper electrode UE is disposed on the second insulation layer 20. In an embodiment, the third insulation layer 30 may include a single-layered silicon oxide layer. The first connection electrode CNE1 may be disposed on the third insulation layer 30. The first connection electrode CNE1 may be connected to the signal line SCL through a contact hole CNT-1 passing through the first to third insulation layers 10 to 30.

A fourth insulation layer 40 covering the first connection electrode CNE1 may be disposed on the third insulation layer 30. The fourth insulation layer 40 may be a single-layered silicon oxide layer. The fourth insulation layer 40 is disposed on a fifth insulation layer 50. The fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 covering the second connection electrode CNE2 is disposed on the fifth insulation layer 50. The sixth insulation layer 60 may be an inorganic layer. A first electrode AE is disposed on the sixth insulation layer 60. The first electrode AE is connected to the second connection electrode CNE2 through a contact hole CNT-3 passing through the sixth insulation layer 60. An opening OP is defined in the pixel defining layer PDL. The opening OP of the pixel defining layer PDL exposes at least a portion of the first electrode AE.

As illustrated in FIG. 5A, the display area DP-PA may include an emission area PXA and a non-emission area NPXA adjacent to the emission area PXA. The non-emission area NPXA may surround the emission area PXA. In an embodiment, the emission area PXA may be defined to correspond to a portion of an area of the first electrode AE exposed by the opening OP.

A hole control layer HCL may be commonly disposed on the emission area PXA and the non-emission area NPXA. The hole control layer HCL may include a hole transport layer and may further include a hole injection layer. An emission layer EML is disposed on the hole control layer HCL. The emission layer EML may be disposed on an area corresponding to the opening OP. For instance, the emission layer EML may be formed to be separated from each of the pixels PX.

An electron control layer ECL is disposed on the emission layer EML. The electron control layer ECL may include an electron transport layer and may further include an electron injection layer. The hole control layer HCL and the electron control layer ECL may be commonly formed on the plurality of pixels PX using an open mask. A second electrode CE is disposed on the electronic control layer ECL. The second electrode CE is provided as a single body and commonly disposed on the plurality of pixels PX (see FIG. 4).

As illustrated in FIGS. 5A and 5B, the upper insulation layer TFL is disposed on the second electrode CE. The upper insulation layer TFL may include a plurality of thin films. According to some embodiments, the upper insulation layer TFL may include a capping layer CPL and a thin film encapsulation layer TFE. The thin film encapsulation layer TFE may include a first inorganic layer IOL1, an organic layer IOL2, and a second inorganic layer IOL3.

The capping layer CPL is disposed on the second electrode CE to contact the second electrode CE. The capping layer CPL may include an organic material. The first inorganic layer IOL1 is disposed on the capping layer CPL to contact the capping layer CPL. The organic layer IOL2 is disposed on the first inorganic layer IOL1 to contact the first inorganic layer IOL1. The second inorganic layer IOL3 is disposed on the organic layer IOL2 to contact the organic layer IOL2.

The capping layer CPL may protect the second electrode CE from a follow-up process, for example, a sputtering process, and may improve emission efficiency of the organic light emitting diode OLED. The capping layer CPL may have a refractive index greater than that of the first inorganic layer IOL1.

The first inorganic layer IOL1 and the second inorganic layer IOL3 may protect the display element layer DP-OLED against oxygen and/or moisture, and the organic layer IOL2 may protect the display element layer DP-OLED against foreign substances, such as dust particles. Each of the first inorganic layer IOL1 and the second inorganic layer IOL3 may be at least one of a silicon oxide layer, a silicon nitride layer, a silicon oxynitride layer, and a silicon oxide layer. According to an embodiment, each of the first inorganic layer IOL1 and the second inorganic layer IOL3 may include a titanium oxide layer, an aluminum oxide layer, and/or the like. The organic layer OL may include an acrylic-based organic layer, but is not limited thereto.

According to an embodiment, an inorganic layer, for example, a lithium fluoride (LiF) layer, may be further disposed between the capping layer CPL and the first inorganic layer IOL1. The LiF layer may improve emission efficiency of the organic light emitting diode OLED.

Figure 6:
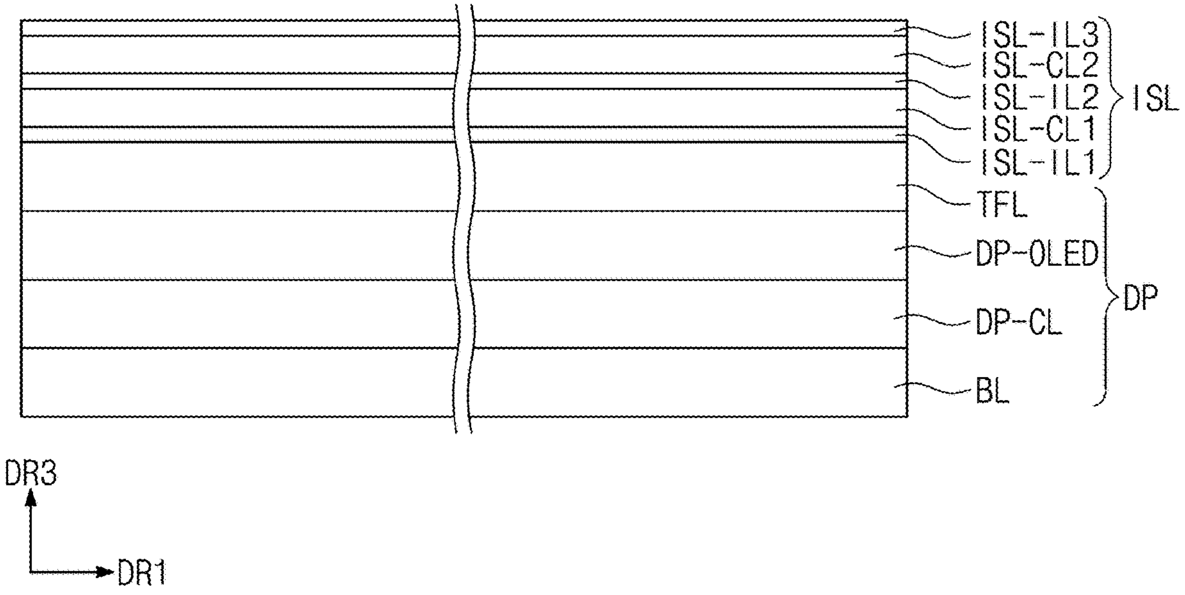
FIG. 6 is a cross-sectional view of an input sensor according to some embodiments.

FIG. 6 is a cross-sectional view of an input sensor according to some embodiments.

As illustrated in FIG. 6, the input sensor ISL may include a first insulation layer ISL-IL1 (hereinafter, referred to as a first input insulation layer), a first conductive layer ISL-CL1, a second insulation layer ISL-IL2 (hereinafter, referred to as a second input insulation layer), a second conductive layer ISL-CL2, and a third insulation layer ISL-IL3 (hereinafter, referred to as a third input insulation layer). The first input insulation layer ISL-IL1 may be directly disposed on the upper insulation layer TFL. In an embodiment, the first input insulation layer ISL-IL1 may be omitted.

Each of the first conductive layer ISL-CL1 and the second conductive layer ISL-CL2 may have a single-layered structure or a multi-layered structure in which a plurality of layers are laminated in the third directional axis DR3. A conductive layer having the multi-layered structure may include at least two of transparent conductive layers and metal layers. The conductive layer having the multi-layered structure may include metal layers including metals different from each other. The transparent conductive layer may at least one of include indium tin oxide (ITO), indium zinc oxide (IZO), zinc oxide (ZnO), indium tin zinc oxide (ITZO), poly(3,4-ethylenedioxythiophene) (PEDOT), metal nano wire, and graphene. The metal layer may be formed of molybdenum, silver, titanium, copper, aluminum, and/or an alloy thereof. For example, each of the first and second conductive layers ISL-CL1 and ISL-CL2 may have a three-layered metal structure, for example, a three-layered structure of titanium/aluminum/titanium. A metal having relatively high durability and low reflectance may be applied to an outer layer, and a metal having high electrical conductivity may be applied to an inner layer.

Each of the first and second conductive layers ISL-CL1 and ISL-CL2 may include a plurality of patterns. Hereinafter, an example in which the first conductive layer ISL-CL1 includes first conductive patterns, and the second conducive layer ISL-CL2 includes second conductive patterns will be described. As will become more apparent below, each of the first and second conductive patterns ISL-CL1 and ISL-CL2 may include sensing electrodes and signal lines connected to the sensing electrodes.

Each of the first to third input insulation layers ISL-IL1 to ISL-IL3 may include an inorganic or organic layer. In an embodiment, each of the first input insulation layer ISL-IL1 and the second input insulation layer ISL-IL2 may be an inorganic layer. The inorganic layer may include at least one of oxide, titanium oxide, silicon oxide, silicon oxide nitride, zirconium oxide, and hafnium oxide. The third input insulation layer ISL-IL3 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 7A:
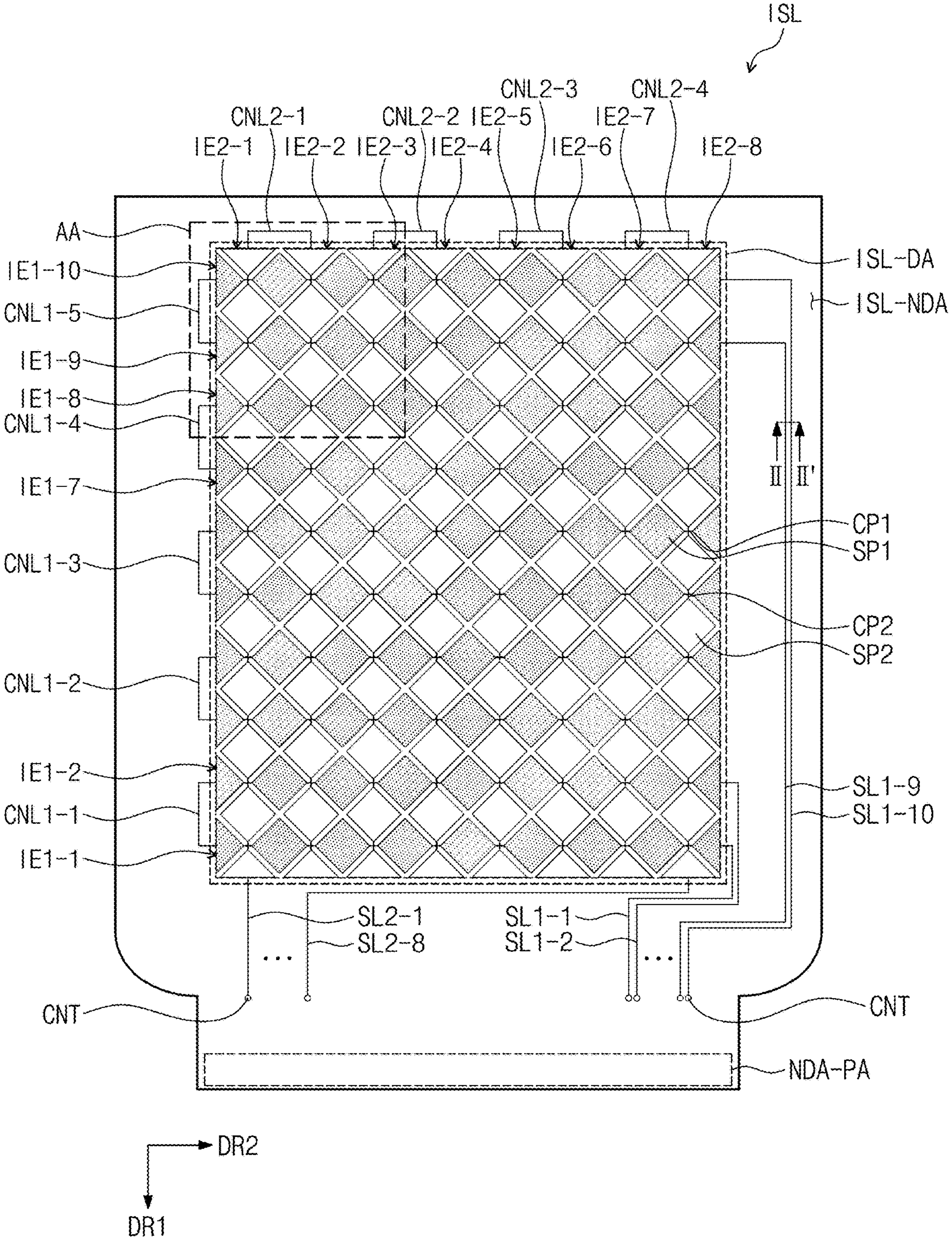
FIG. 7A is a plan view of the input sensor of FIG. 6 according to some embodiments.
Figure 7B:
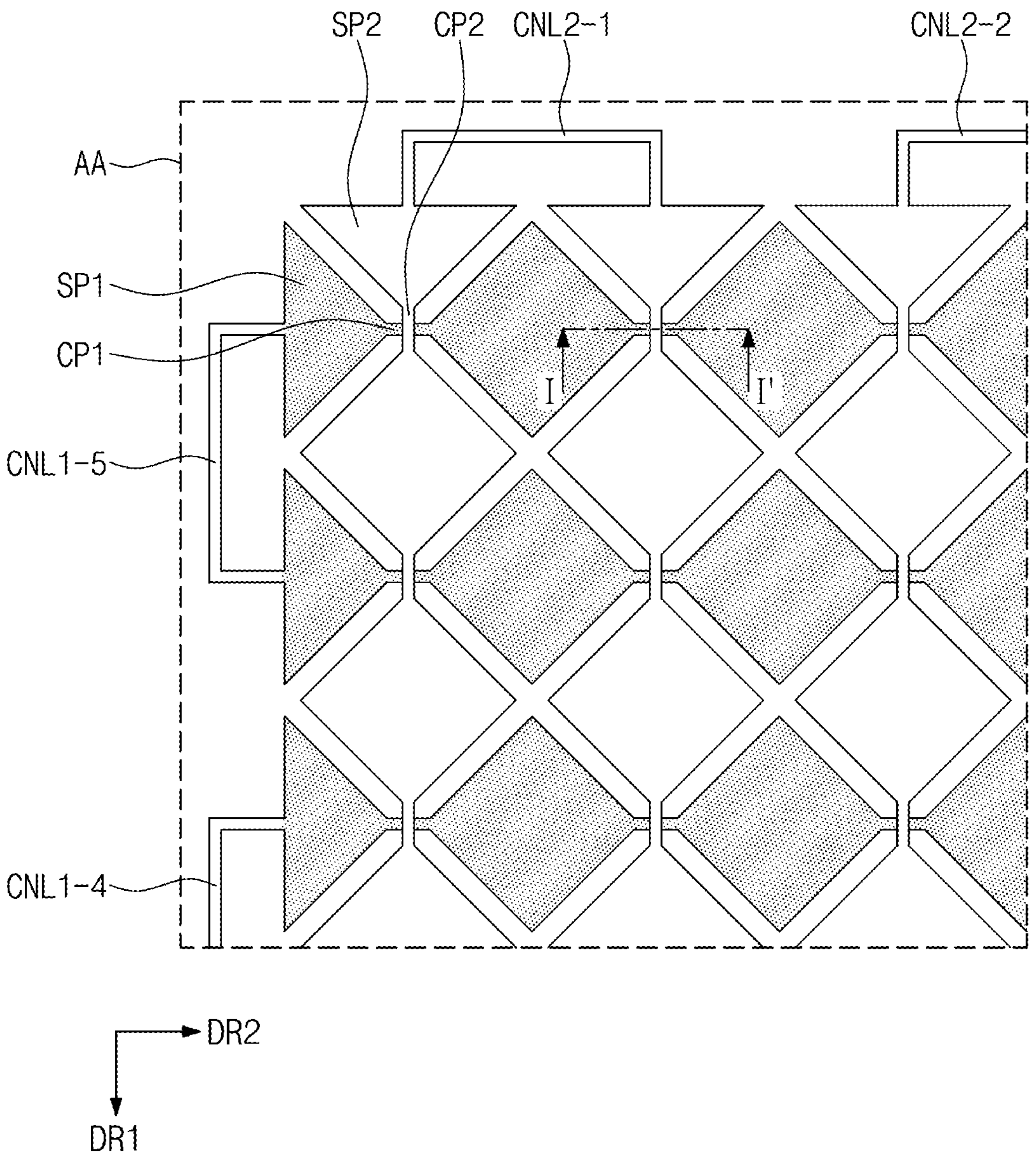
FIG. 7B is an enlarged view of a first area of the input sensor of FIG. 7A according to some embodiments.
Figure 7C:
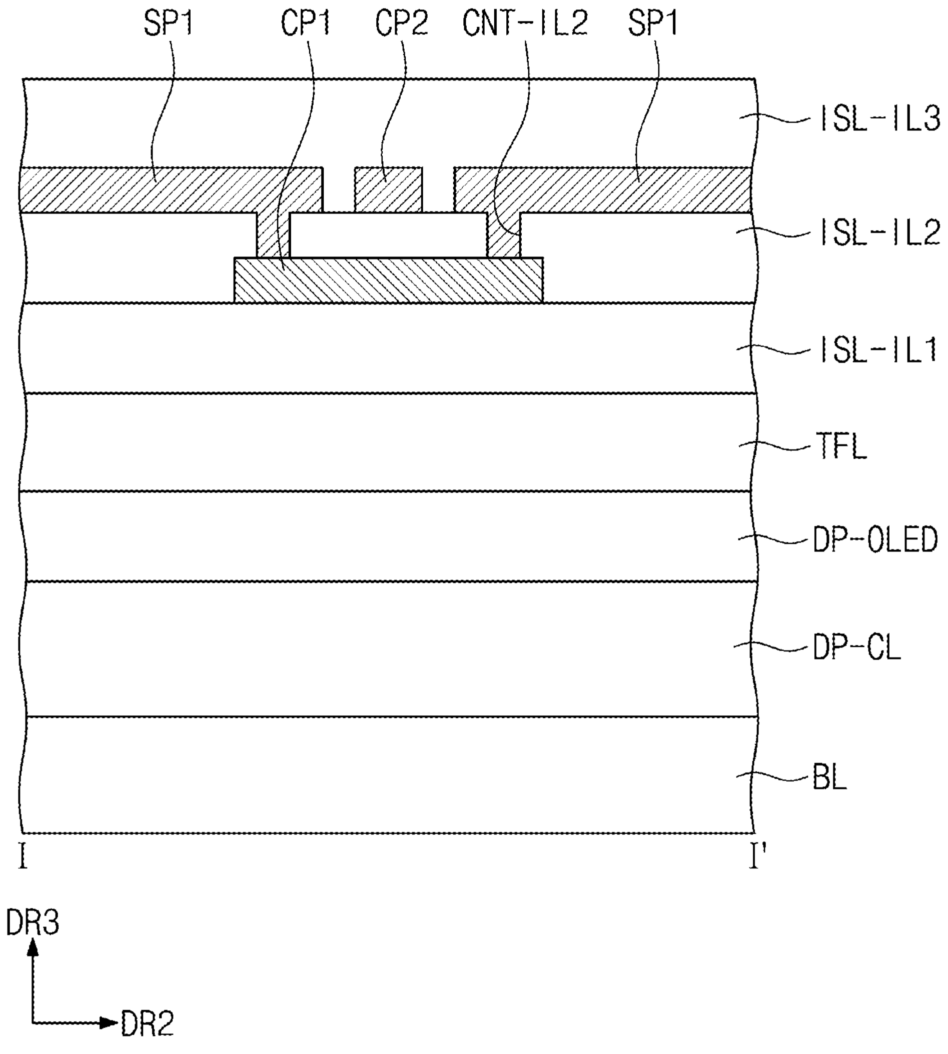
FIGS. 7C and 7D are partial cross-sectional views of the input sensor of FIG. 6 according to various embodiments.
Figure 7D:
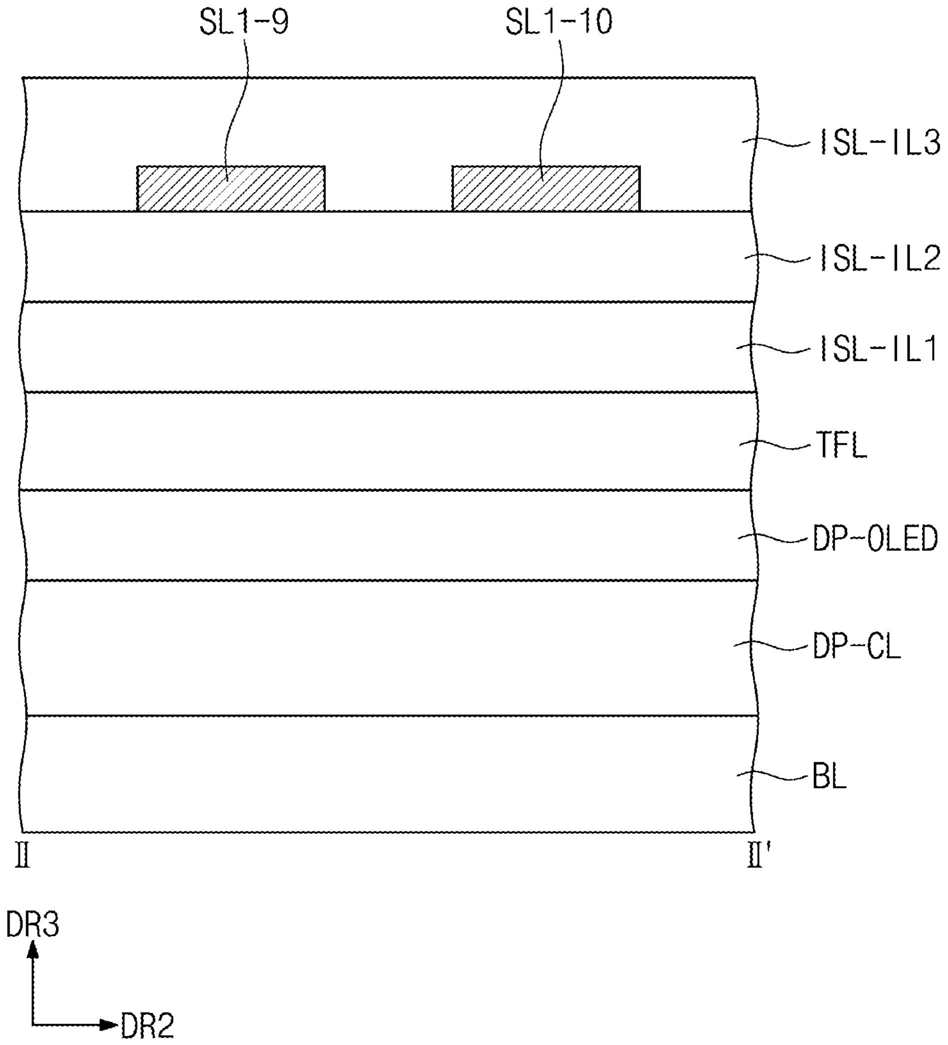
Figure 7E:
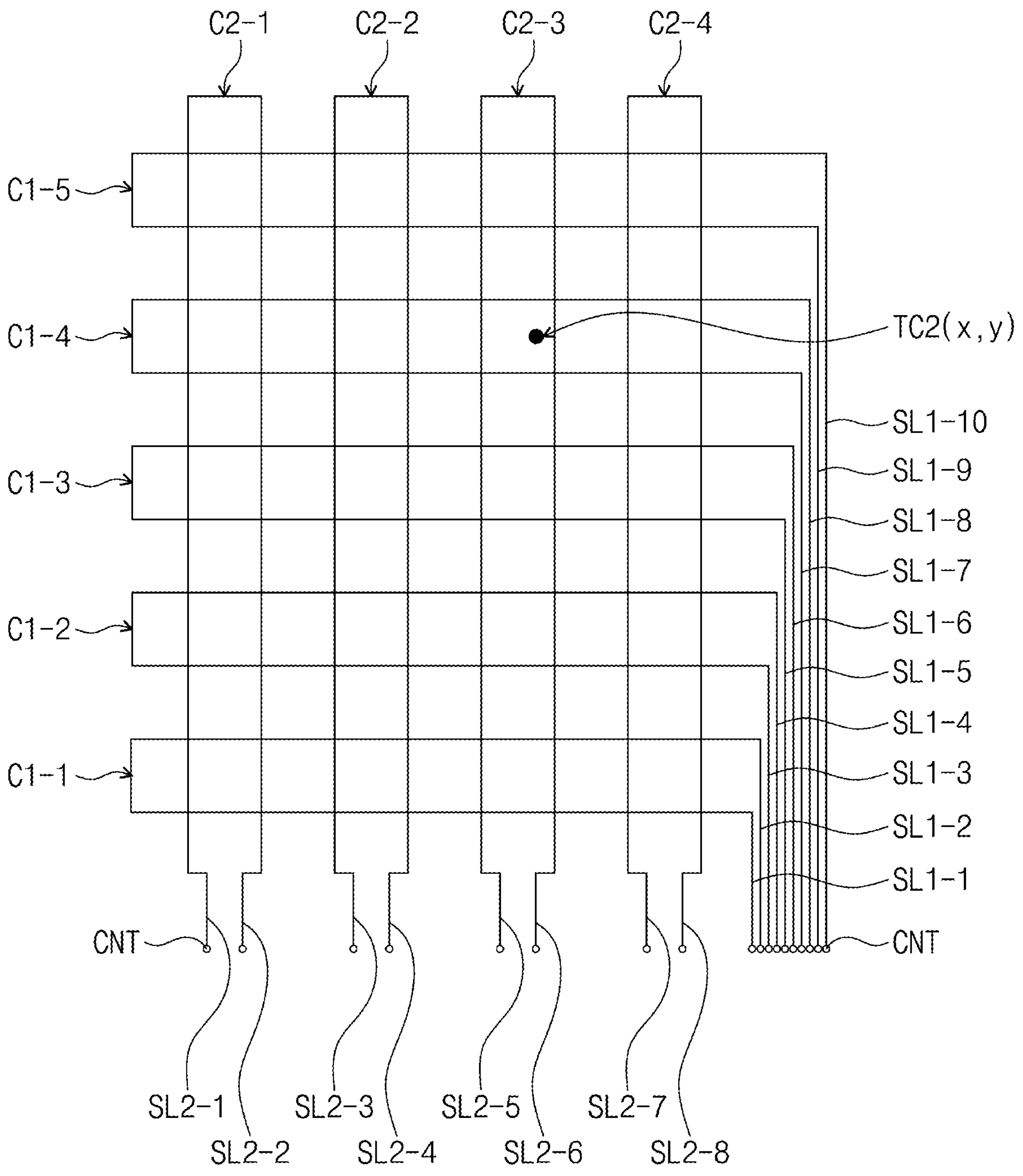
FIG. 7E is a schematic view illustrating first sensing electrodes and second sensing electrodes of the input sensor of FIG. 7A according to some embodiments.

FIG. 7A is a plan view of the input sensor ISL according to some embodiments. FIG. 7B is an enlarged view illustrating a first area AA of the input sensor ISL of FIG. 7A according to some embodiments. FIGS. 7C, 7D, and 7E are partial cross-sectional views of the input sensor ISL according to various embodiments.

As illustrated in FIGS. 7A and 7B, the input sensor ISL may include first sensing electrodes IE1-1 to IE1-10, second sensing electrodes IE2-1 to IE2-8, first connection lines CNL1-1 to CNL1-5, second connection lines CNL2-1 to CNL2-4, first sensing lines SL1-1 to SL1-10, and second sensing lines SL2-1 to SL2-8. The input sensor ISL may include a sensing area ISL-DA and a line area ISL-NDA, which respectively correspond to the display area DP-DA and the non-display area DP-NDA of the display panel DP. The sensing area ISL-DA may be defined as an area on (or in) which the first sensing electrodes IE1-1 to IE1-10 and the second sensing electrodes IE2-1 to IE2-8 are disposed. The first connection lines CNL1-1 to CNL1-5, the second connection lines CNL2-1 to CNL2-4, the first sensing lines SL1-1 to SL1-10, and the second sensing lines SL2-1 to SL2-8 are disposed on the line area ISL-NDA.

In an embodiment, the input sensor ISL may be a capacitive touch sensor. One of the first sensing electrodes IE1-1 to IE1-10 and the second sensing electrodes IE2-1 to IE2-8 receives a driving signal, and the other outputs a variation in capacitance between the first sensing electrodes IE1-1 to IE1-10 and the second sensing electrodes IE2-1 to IE2-8 as a sensing signal.

Each of the first sensing electrodes IE1-1 to IE1-10 may extend in the second direction DR2. Also, the first sensing electrodes IE1-1 to IE1-10 may be sequentially arranged in the first direction DR1.

Each of the second sensing electrodes IE2-1 to IE2-8 may extend in the first direction DR1. Also, the second sensing electrodes IE2-1 to IE2-8 may be sequentially arranged in the second direction DR2.

The first sensing lines SL1-1 to SL1-10 may include the same number of signal lines as the first sensing electrodes IE1-1 to IE1-10. The first sensing lines SL1-1 to SL1-10 may be connected to at least one end of both ends of each of the first sensing electrodes IE1-1 to IE1-10. The second sensing lines SL2-1 to SL2-8 may include the same number of signal lines as the second sensing electrodes IE2-1 to IE2-8. The second sensing lines SL2-1 to SL2-8 may be connected to at least one end of both ends of each of the second sensing electrodes IE2-1 to IE2-8.

The first sensing lines SL1-1 to SL1-10 may be connected to some of the auxiliary lines SSL (see FIG. 4) disposed at one side of the pad area NDA-PA through the contact holes CNT. The second sensing lines SL2-1 to SL2-8 may be connected to some of the auxiliary lines SSL (see FIG. 4) disposed on the other side of the pad area NDA-PA through the contact holes CNT.

The contact holes CNT may pass through the insulation layers disposed between the first sensing lines SL1-1 to SL1-10 and the second sensing lines SL2-1 to SL2-8 and the auxiliary lines SSL. The contact holes CNT pass through a portion of the first to sixth insulation layers 10 to 60 (see FIG. 5A) and then pass through the first input insulation layer ISL-IL1 (see FIG. 6) and the second input insulation layer ISL-IL2 (see FIG. 6) of the input sensor ISL.

Each of the first sensing electrodes IE1-1 to IE1-10 includes a plurality of first sensing parts SP1 and a plurality of first connection parts CP1. Each of the second sensing electrodes IE2-1 to IE2-8 includes a plurality of second sensing parts SP2 and a plurality of second connection parts CP2.

Each of the first connection lines CNL1-1 to CNL1-5 electrically connects two corresponding first sensing electrodes (hereinafter, pair of first sensing electrodes) to each other among the first sensing electrodes IE1-1 to IE1-10. For example, the first connection line CNL1-1 electrically connects the first sensing electrodes IE1-1 and IE1-2 to each other, and the second connection line CNL1-2 electrically connects the first sensing electrodes IE1-3 and IE1-4 to each other. In the example illustrated in FIG. 7A, the first connection lines CNL1-1 to CNL1-5 electrically connect the respective pairs of first sensing electrodes adjacent to each other to each other among the first sensing electrodes IE1-1 to IE1-10, but embodiments are not limited thereto. For example, the first connection line CNL1-1 may electrically connect the first sensing electrodes IE1-1 and IE1-3, which are not adjacent to each other, to each other.

The first connection lines CNL1-1 to CNL1-5 may be connected to the other ends of the first sensing electrodes IE1-1 to IE1-10, to which the first sensing lines SL1-1 to SL1-10 are not connected, among both (or opposing) ends of the first sensing electrodes IE1-1 to IE1-10, respectively. The first sensing lines SL1-1 to SL1-10 may be disposed on the same layer with the same material as the first sensing parts SP1.

Each of the second connection lines CNL2-1 to CNL2-4 electrically connects two corresponding second sensing electrodes (hereinafter, pair of second sensing electrodes) to each other among the second sensing electrodes IE2-1 to IE2-8. For example, the second connection line CNL2-1 electrically connects the second sensing electrodes IE2-1 and IE2-2 to each other, and the first connection line CNL2-2 electrically connects the second sensing electrodes IE2-3 and IE2-4 to each other. In the example illustrated in FIG. 7A, the second connection lines CNL2-1 to CNL2-4 electrically connect the respective pairs of first sensing electrodes adjacent to each other to each other among the second sensing electrodes IE2-1 to IE2-4, but embodiments are not limited thereto. For example, the second connection line CNL2-1 may electrically connect the second sensing electrodes IE2-1 and IE2-3, which are not adjacent to each other, to each other.

The second connection lines CNL2-1 to CNL2-4 may be connected to the other ends of the second sensing electrodes IE2-1 to IE2-8, to which the second sensing lines SL2-1 to SL2-8 are not connected, among both (or opposing) ends of the second sensing electrodes IE2-1 to IE2-8, respectively. The second sensing lines SL2-1 to SL2-8 may be disposed on the same layer with the same material as the second sensing parts SP2.

FIG. 7C is a cross-sectional view taken along sectional line I-I' of FIG. 7B according to some embodiments. FIG. 7C illustrates an example in which the first connection part CP1 and the second connection part CP2 cross each other. In an embodiment, the first connection part CP1 may correspond to a bridge pattern. In another embodiment, the second connection part CP2 may be the bridge pattern.

As illustrated in FIGS. 7B and 7C, the plurality of first connection parts CP1 may be formed from the first conductive layer ISL-CL1 (see FIG. 6), and the plurality of first sensing parts SP1, the plurality of second sensing parts SP2, and the plurality of second connection parts CP2 may be formed from the second conductive layer ISL-CL2. The first sensing parts SP1 and the first connection part CP1 may be connected to each other through contact holes CNT-IL2 passing through the second input insulation layer ISL-IL2.

In an embodiment, although the plurality of first connection parts CP1 and the plurality of second connection parts CP2 cross each other, embodiments are not limited thereto. For example, each of the first connection parts CP1 may be formed into a "/\"-shaped curved line and/or a "\/"-shaped curved line so that the first connection parts CP1 do not overlap the second connection parts CP2. The first connection parts CP1 having the "/\"-shaped curved line and/or a "\/"-shaped curved line may overlap the second sensing parts SP2 on a plane.

According to some embodiments, the first sensing lines SL1-1 to SL1-10 and the second sensing lines SL2-1 to SL2-8 include at least one of a portion disposed on the same layer as the first sensing electrodes IE1-1 to IE1-10 or a portion disposed on the same layer as the second sensing electrodes IE2-1 to IE2-8.

FIG. 7D is a cross-sectional view taken along sectional line II-II' of FIG. 7A according to some embodiments. For instance, in FIG. 7D, the first sensing lines SL1-9 and SL1-10 of the first sensing lines SL1-1 to SL1-10 are illustrated as an example. The first sensing lines SL1-1 to SL1-10 include at least portions disposed on the same layer as the first sensing electrodes IE1-1 to IE1-10, e.g., the second conductive layer ISL-CL2 (see FIG. 6). The first sensing lines SL1-1 to SL1-10 and the second sensing lines SL2-1 to SL2-8 may further include portions formed from the first conductive layer ISL-CL1 (see FIG. 6).

Referring again to FIG. 7A, in a first sensing mode in which the first input TC1 (see FIG. 1) of the user is sensed, the first sensing electrodes IE1-1 to IE1-10 and the second sensing electrodes IE2-1 to IE2-8 sense the first input TC1 of the user and output the sensed signals to at least one of the first sensing lines SL1-1 to SL1-10 and the second sensing lines SL2-1 to SL2-8.

In a second sensing mode in which the second input TC2 (see FIG. 1) of the electronic pen EP is sensed, the respective pairs of first sensing electrodes lines IE1-1 to IE1-10 and the respective pairs of second sensing electrodes lines IE2-1 to IE2-8 sense the second input TC2 and output the sensed signals to at least one of the first sensing lines SL1-1 to SL1-10 and the second sensing lines SL2-1 to SL2-8. In the second sensing mode, for example, a loop provided by the first sensing line SL1-1, the first sensing electrode IE1-1, the first connection line CNL1-1, the first sensing electrode IE1-2, and the first sensing line SL1-2 may resonate with a capacitor disposed inside the electronic pen EP to emit electromagnetic force or receive touch information.

As illustrated in FIG. 7A, the input sensor ISL may further include first connection lines CNL1-1 to CNL1-5 and second connection lines CNL2-1 to CNL2-4 in addition to the first sensing electrodes IE1-1 to IE1-10 and the second sensing electrodes IE2-1 to IE2-8 so as to sense the first input TC1 (see FIG. 1) of the user and to sense the second input TC2 (see FIG. 1) of the electronic pen EP. Accordingly, the input sensor ISL and the display device DD (see FIG. 2) including the input sensing ISL may be capable of sensing the first input TC1 and the second input TC2 of the user while minimizing (or at least reducing) an increase in production cost.

FIG. 7E is a schematic view illustrating first sensing electrodes and second sensing electrodes of the input sensor of FIG. 7A according to some embodiments. For instance, FIG. 7E schematically illustrates the first sensing electrodes IE1-1 to IE1-10 and the second sensing electrodes IE2-1 to IE2-8 of the input sensor ISL illustrated in FIG. 7A, and will be utilized to explain the second sensing mode in which the second input TC2 of the electronic pen EP is sensed according to some embodiments.

Referring to FIGS. 7A and 7E, at least one of the first sensing electrodes IE1-1 to IE1-10 and the second sensing electrodes IE2-1 to IE2-8 may operate as a driving coil through which current flows to induce magnetic force lines, and the other of the first sensing electrodes IE1-1 to IE1-10 and the second sensing electrodes IE2-1 to IE2-8 may operates as a sensing coil in which a voltage is induced by the magnetic force lines.

For example, first coils C1-1 to C1-5 provided by the first sensing lines SL1-1 to SL1-10 and the first sensing electrodes IE1-1 to IE1-10 may operate as driving coils. Second coils C2-1 to C2-4 provided by the second sensing lines SL2-1 to SL2-8 and the second sensing electrodes IE2-1 to IE2-8 may operate as sensing coils.

Each of the first coils C1-1 to C1-5 receives current from the second sensing circuit EP-C (see FIG. 4) to form a current path in the form of a closed loop. When the electronic pen EP (see FIG. 1) approaches one of the first coils C1-1 to C1-5, the capacitor within the electronic pen EP may resonate to generate magnetic fields around the current path. Since the current flows through one of the second coils C2-1 to C2-4 by the magnetic fields, the second coils C2-1 to C2-4 may sense a change of the signals received from the second sensing lines SL2-1 to SL2-8 to sense the second input TC2 of the electronic pen EP.

For example, it will be assumed that the second input TC2 is inputted at a predetermined position (x, y). When current flows through the first coil C1-4 adjacent to the predetermined position (x, y), the magnetic fields may resonate with the first coil C1-4 and the capacitor, which is disposed inside the electronic pen EP, to generate magnetic fields. The current flows through the second coil C2-3 that crosses (e.g., is perpendicular to) the first coil C1-4 and adjacent to the predetermined positions (x, y). The second sensing circuit EP-C may sense a change in current flowing through the second sensing line SL2-5 and the second sensing line SL2-6 to detect an input position (x, y) of the second input TC2.

Figure 8A:
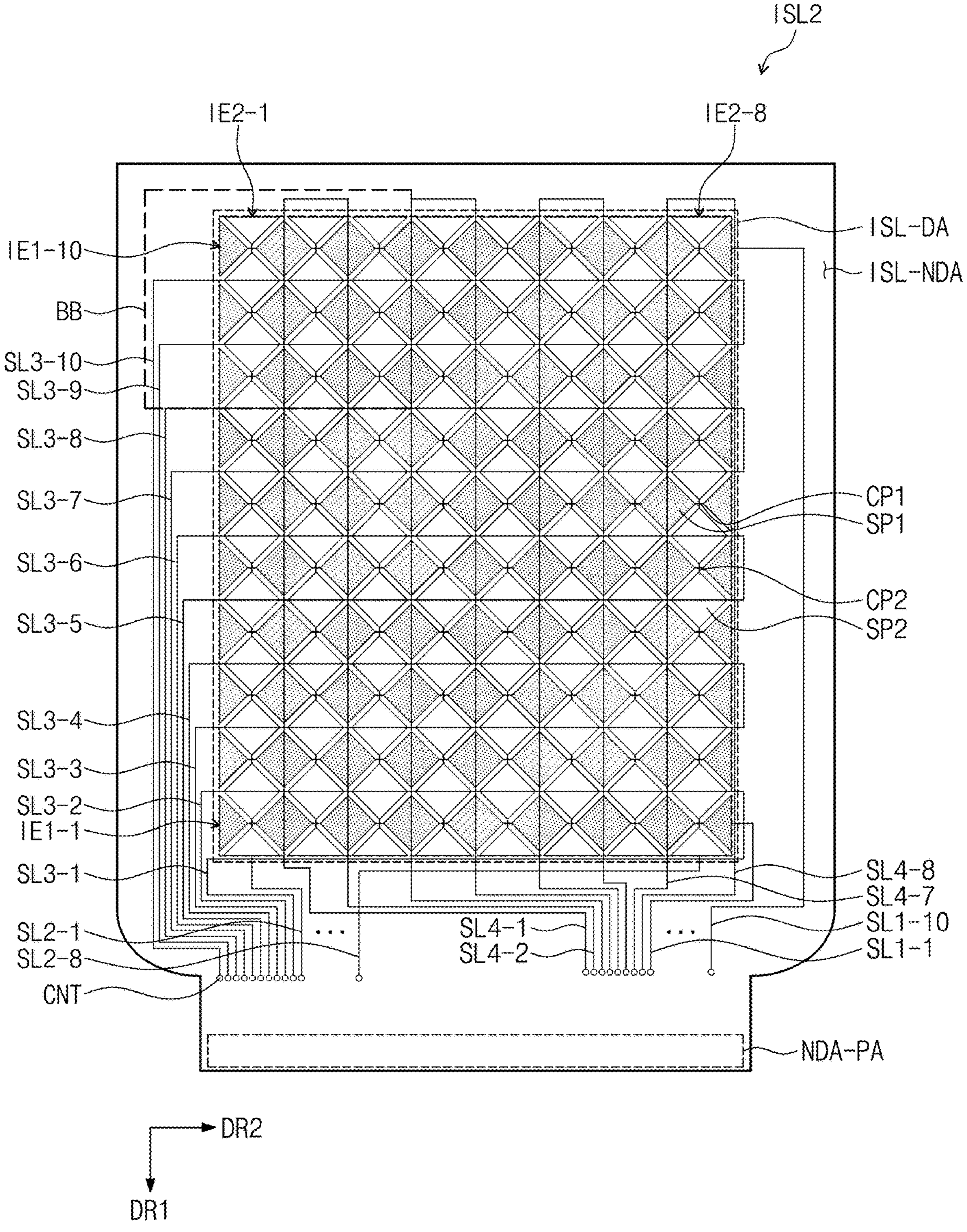
FIG. 8A is a plan view of an input sensor according to some embodiments.
Figure 8B:
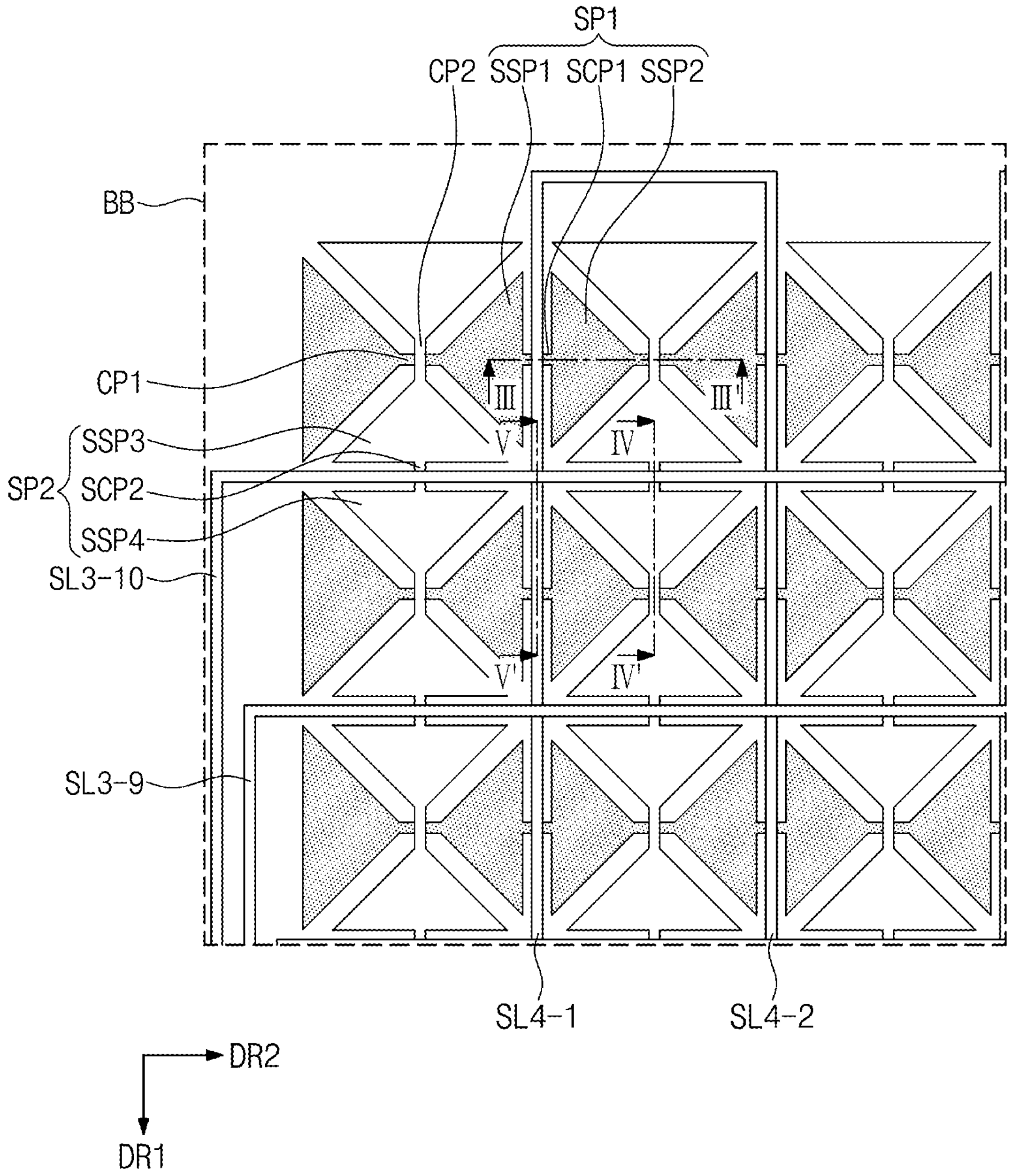
FIG. 8B is an enlarged view illustrating a second area of the input sensor of FIG. 8A according to some embodiments.
Figure 8C:
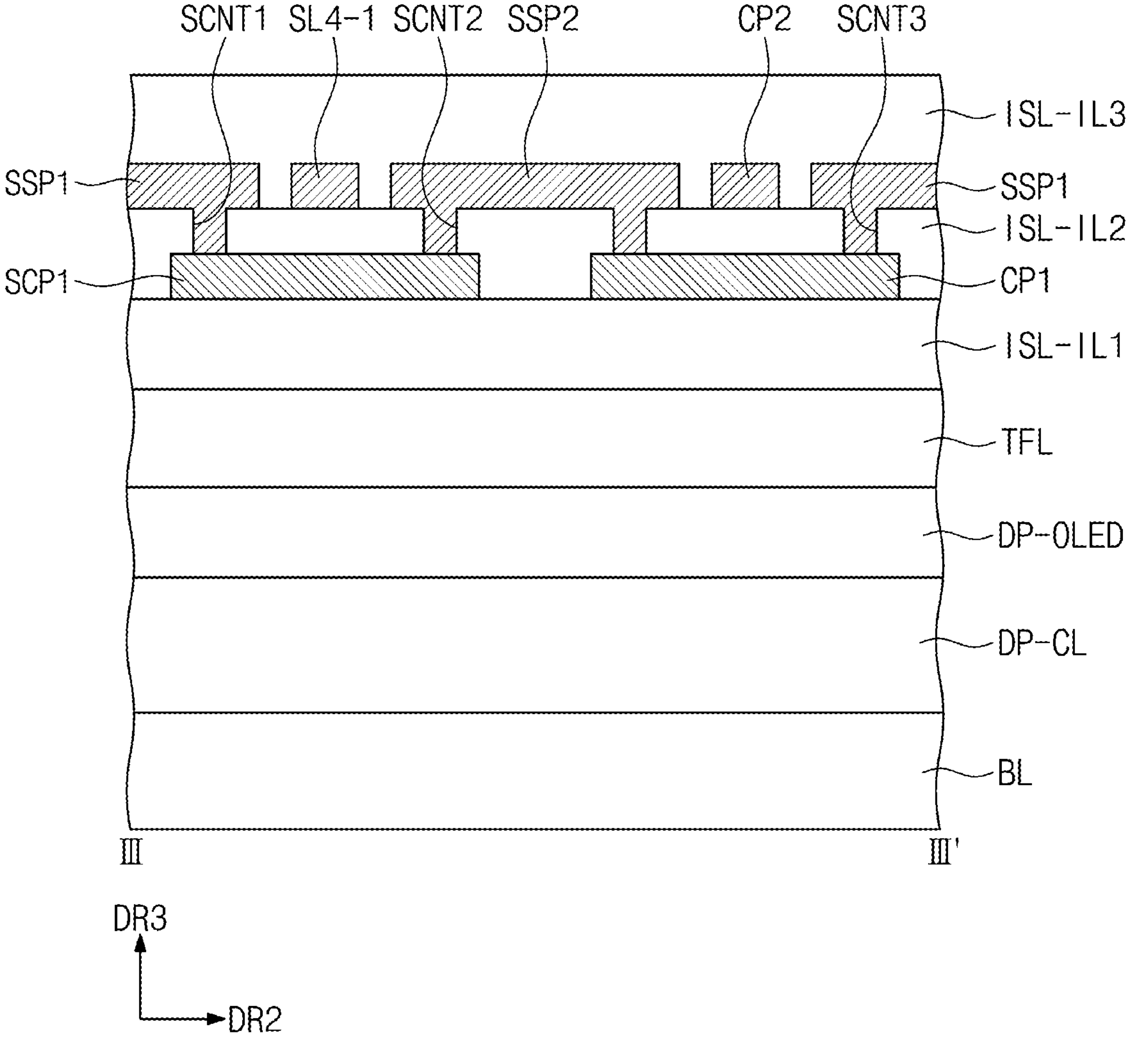
FIGS. 8C, 8D, and 8E are partial cross-sectional views of the input sensor of FIG. 8A according to some embodiments.
Figure 8D:
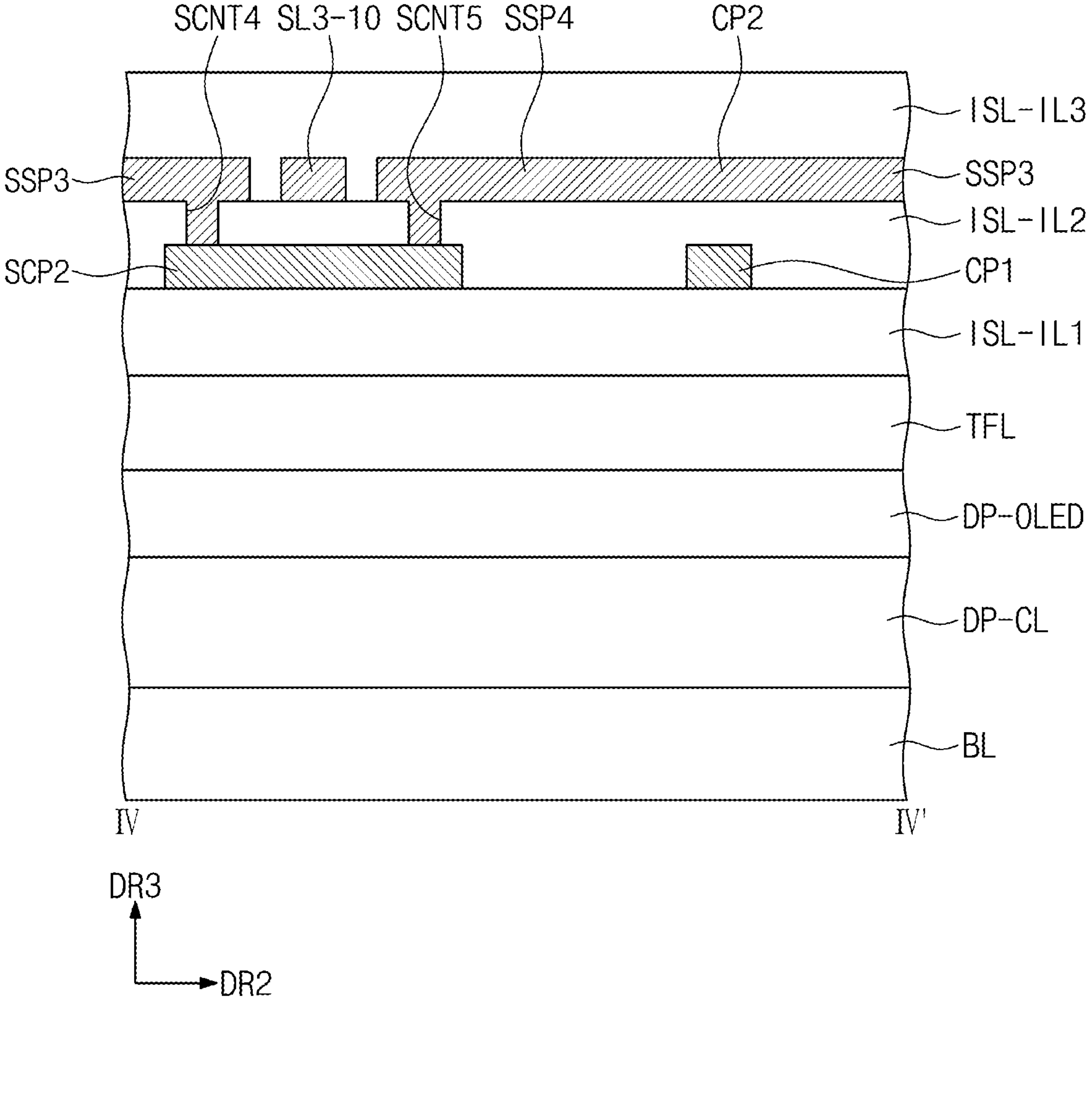
Figure 8E:
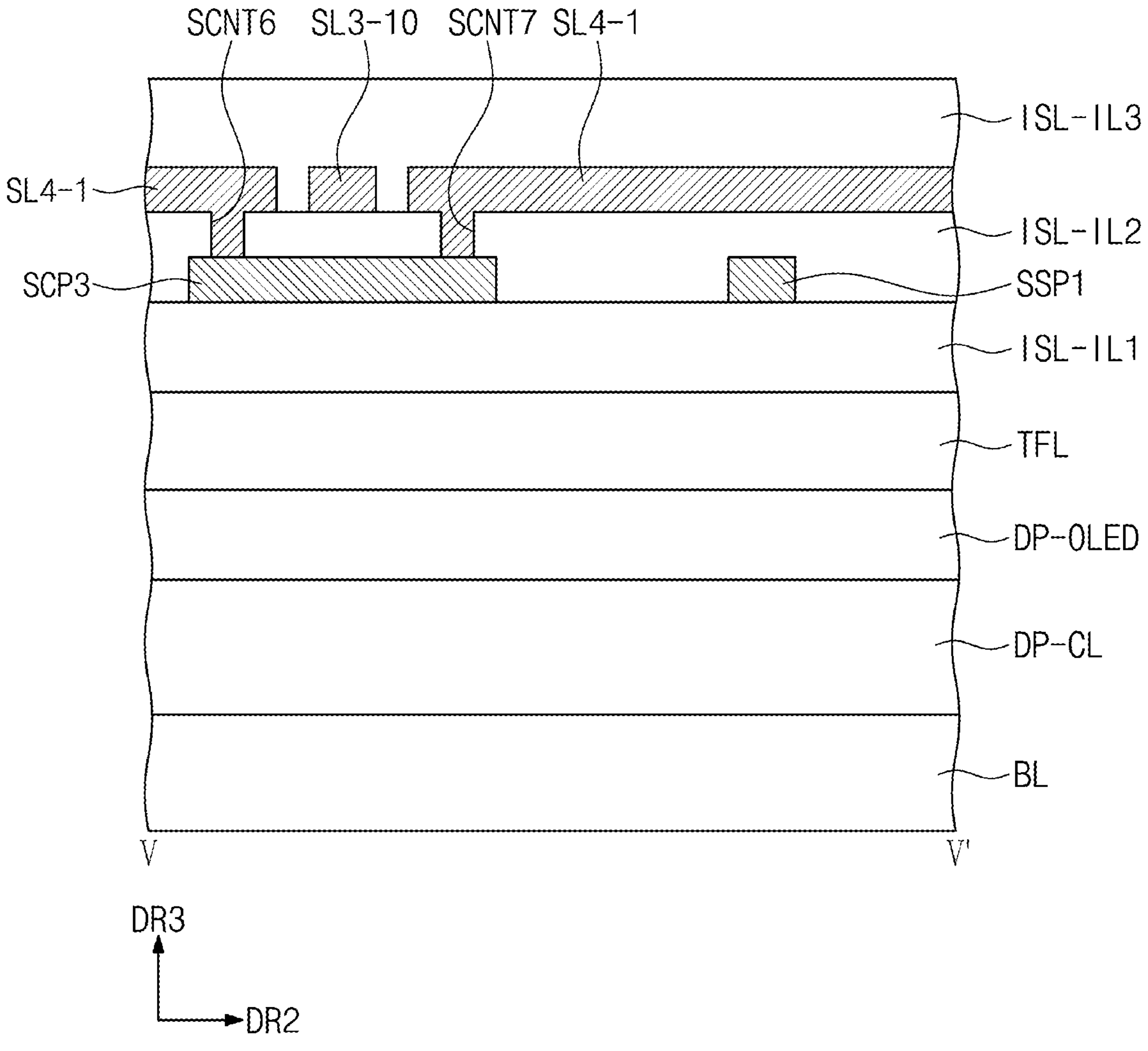

FIG. 8A is a plan view of an input sensor ISL2 according to some embodiments. FIG. 8B is an enlarged view illustrating a second area BB of the input sensor ISL2 of FIG. 8A according to some embodiments. FIGS. 8C, 8D, and 8E are partial cross-sectional views of the input sensor ISL2 according to various embodiments. Hereinafter, detailed descriptions with respect to the same constituent as described with reference to FIGS. 1 to 7E will be omitted.

As illustrated in FIGS. 8A and 8B, the input sensor ISL2 includes first sensing electrodes IE1-1 to IE1-10, second sensing electrodes IE2-1 to IE2-8, first sensing lines SL1-1 through SL1-10, second sensing lines SL2-1 through SL2-8, third sensing lines SL3-1 through SL3-10, and fourth sensing lines SL4-1 to SL4-8. The input sensor ISL2 may include a sensing area ISL-DA and a line area ISL-NDA that respectively correspond to the display area DP-DA and the non-display area DP-NDA of the display panel DP. The sensing area ISL-DA may be defined as an area on which the first sensing electrodes IE1-1 to IE1-10 and the second sensing electrodes IE2-1 to IE2-8 are disposed. The first sensing lines SL1-1 to SL1-10, the second sensing lines SL2-1 to SL2-8, the third sensing lines SL3-1 to SL3-10, and the fourth sensing lines SL4-1 to SL4-8 are disposed on the line area ISL-NDA.

Each of the first sensing electrodes IE1-1 to IE1-10 may extend in the second direction DR2. Also, the first sensing electrodes IE1-1 to IE1-10 may be sequentially arranged in the first direction DR1. Each of the second sensing electrodes IE2-1 to IE2-8 may extend in the first direction DR1. Also, the second sensing electrodes IE2-1 to IE2-8 may be sequentially arranged in the second direction DR2.

The first sensing lines SL1-1 to SL1-10 may include the same number of signal lines as the number of the first sensing electrodes IE1-1 to IE1-10. The first sensing lines SL1-1 to SL1-10 may be connected to at least one end of both ends of each of the first sensing electrodes IE1-1 to IE1-10. The second sensing lines SL2-1 to SL2-8 may include the same number of signal lines as the number of the second sensing electrodes IE2-1 to IE2-8. The second sensing lines SL2-1 to SL2-8 may be connected to at least one end of both ends of each of the second sensing electrodes IE2-1 to IE2-8.

The first sensing lines SL1-1 to SL1-10 may be connected to some of the auxiliary lines SSL (refer to FIG. 4) disposed at (or near) one side of the pad area NDA-PA through the contact holes CNT. The second sensing lines SL2-1 to SL2-8 may be connected to some of the auxiliary lines SSL (see FIG. 4) disposed at the other side of the pad area NDA-PA through the contact holes CNT.

The contact holes CNT may pass through the insulation layers disposed between the first sensing lines SL1-1 to SL1-10 and the second sensing lines SL2-1 to SL2-8 and the auxiliary lines SSL. For instance, the contact holes CNT may pass through a portion of the first to sixth insulation layers 10 to 60 (see FIG. 5A) and then may pass through the first input insulation layer ISL-IL1 and the second input insulation layer ISL-IL2 of the input sensor ISL (see FIG. 6).

Each of the first sensing electrodes IE1-1 to IE1-10 includes a plurality of first sensing parts SP1 and a plurality of first connection parts CP1. Each of the plurality of first sensing parts SP1 includes a first sub-sensor part SSP1, a second sub-sensor part SSP2, and a first sub-connection part SCP1. The first sub-sensor part SSP1 and the second sub-sensor part SSP2 are spaced apart from each other in the second direction DR2. The first sub-connection part SCP1 electrically connects the first sub-sensor part SP1 to the second sub-sensor part SP2. A width and shape of the first sub-connection part SCP1 in the first direction DR1 are not limited to those illustrated in FIG. 8B and may be variously changed. For example, the first sub-connection part SCP1 may include a plurality of bridges arranged in parallel and spaced apart from each other in the first direction DR1 between the first sub-sensor part SSP1 and the second sub-sensor part SSP2.

Each of the second sensing electrodes IE2-1 to IE2-8 includes a plurality of second sensing parts SP2 and a plurality of second connection parts CP2. Each of the plurality of second sensing parts SP2 includes a third sub-sensor part SSP3, a fourth sub-sensor part SSP4, and a second sub-connection part SCP2. The third sub-sensor part SSP3 and the fourth sub-sensor part SSP4 are disposed to be spaced apart in the first direction DR1. The second sub-connection part SCP2 electrically connects the third sub-sensor part SSP3 to the fourth sub-sensor part SSP4. A width and shape of the second sub-connection part SCP2 in the second direction DR2 are not limited to those illustrated in FIG. 8B and may be variously changed. For example, the second sub-connection part SCP2 may include a plurality of bridges arranged in parallel and spaced apart from each other in the second direction DR2 between the third sub-sensor part SSP3 and the fourth sub-sensor part SSP4.

The third sensing lines SL3-1 to SL3-10 may include the same number of signal lines as the number of the first sensing electrodes IE1-1 to IE1-10. The third sensing lines SL3-1 to SL3-10 are disposed between the third sub-sensor part SSP3 and the fourth sub-sensor part SSP4 of the second sensing parts SP2, respectively. Ends of the two corresponding third sensing lines (hereinafter, a pair of third sensing lines) among the third sensing lines SL3-1 to SL3-10 are electrically connected to each other. For example, ends of the third sensing lines SL3-1 and SL3-2, which are the pair of third sensing lines, are electrically connected to each other to provide a loop shape.

The fourth sensing lines SL4-1 to SL4-8 may include the same number of signal lines as the second sensing electrodes IE2-1 to IE2-8. The fourth sensing lines SL4-1 to SL4-8 are disposed between the first sub-sensor part SSP1 and the second sub-sensor part SSP2 of the first sensing parts SP1, respectively. Two corresponding fourth sensing lines (hereinafter, a pair of fourth sensing lines) among the fourth sensing lines SL4-1 to SL4-8 are electrically connected to each other. Ends of the pair of fourth sensing lines among the fourth sensing lines SL4-1 to SL4-8 are electrically connected to each other. For example, ends of the fourth sensing lines SL4-1 and SL4-2, which are the pair of fourth sensing lines, are electrically connected to each other to provide a loop shape.

The third sensing lines SL3-1 to SL3-10 may be connected to some of the auxiliary lines SSL (see FIG. 4) disposed at one side of the pad area NDA-PA through the contact holes CNT. The fourth sensing lines SL4-1 to SL4-8 may be connected to some of the auxiliary lines SSL (see FIG. 4) disposed at the other side of the pad area NDA-PA through the contact holes CNT.

The contact holes CNT may pass through the insulation layers disposed between the third sensing lines SL3-1 to SL3-10 and the fourth sensing lines SL4-1 to SL4-8 and the auxiliary lines SSL. For instance, the contact holes CNT may pass through a portion of the first to sixth insulation layers 10 to 60 (see FIG. 5A) and then may pass through the first input insulation layer ISL-IL1 (see FIG. 6) and the second input insulation layer ISL-IL2 of the input sensor ISL (see FIG. 6).

FIG. 8C is a cross-sectional view taken along sectional line III-III' of FIG. 8B according to some embodiments. FIG. 8D is a cross-sectional view taken along sectional line IV-IV' of FIG. 8B according to some embodiments. FIG. 8E is a cross-sectional view taken along sectional line V-V' of FIG. 8A according to some embodiments. It is noted that FIGS. 8C to 8E illustrate an example in which the first connection part CP1 and the second connection part CP2 cross each other. As seen in FIGS. 8C to 8E, the first connection part CP1 may correspond to a bridge pattern, but in another embodiment, the second connection part CP2 may be the bridge pattern.

Referring to FIGS. 8B, 8C, 8D, and 8E, the plurality of first connection parts CP1, the plurality of first sub-connection parts SCP1, and the plurality of second sub-connection parts SCP2 may be formed from the first conductive layer ISL-CL1 (see FIG. 6), and the plurality of first sensing parts SP1, the plurality of second sensing parts SP2, and the plurality of second connection parts CP2 may be formed from the second conductive layer ISL-CL2. The first sensing parts SP1 and the first connection part CP1 may be connected to each other through contact holes CNT-IL2 passing through the second input insulation layer ISL-IL2. The plurality of first connection parts CP1 may be formed from the first conductive layer ISL-CL1 (see FIG. 6), and the plurality of first sensing parts SP1, the plurality of second sensing parts SP2, and the plurality of second connection parts CP2 may be formed from the second conductive layer ISL-CL2. The first sensing parts SP1 and the first connection part CP1 may be connected to each other through contact holes CNT-IL2 passing through the second input insulation layer ISL-IL2.

In an embodiment, although the plurality of first connection parts CP1 and the plurality of second connection parts CP2 cross each other, embodiments are not limited thereto. For example, each of the first connection parts CP1 may be deformed into a "/\"-shaped curved line and/or a "\/"-shaped curved line so that the first connection parts CP1 do not overlap the second connection parts CP2. The first connection parts CP1 having the "/\"-shaped curved line and/or the "\/"-shaped curved line may overlap the second sensing parts SP2 on a plane.

As shown in FIG. 8C, the first sub-sensor parts SSP1 and the first sub-connection parts SCP1 may be connected to each other through first sub-contact holes SCNT1 passing through the second input insulation layer ISL-IL2. The second sub-sensor parts SSP2 and the first sub-connection parts SCP1 may be connected to each other through second sub-contact holes SCNT2 passing through the second input insulation layer ISL-IL2. Also, the first sub-sensor parts SSP1 and the first connection part CP1 may be connected to each other through third sub-contact holes SCNT3 passing through the second input insulation layer ISL-IL2. As described above, the first sub-sensor parts SSP1 and the second sub-sensor parts SSP2 may be electrically connected to each other by the first sub-connection part SCP1 and the first connection part CP1. Also, the first sub-sensor parts SSP1 and the fourth sensing lines SL4-1 to SL 4-8 may be insulated from each other by the second input insulation layer ISL-IL2.

As illustrated in FIG. 8D, the third sub-sensor parts SSP3 and the second sub-connection parts SCP2 may be connected to each other through fourth sub-contact holes SCNT4 passing through the second input insulation layer ISL-IL2. Also, the fourth sub-sensor parts SSP4 and the second sub-connection parts SCP2 may be connected to each other through fifth sub-contact holes SCNT5 passing through the second input insulation layer ISL-IL2. As described above, the third sub-sensor parts SSP3 and the fourth sub-sensor parts SSP4 may be electrically connected to each other by the second sub-connection part SCP2. Also, the third sub-sensor part SSP3 and the fourth sub-sensor parts SSP4 may be insulated from each other by the second input insulation layer ISL-IL2.

As illustrated in FIG. 8E, the fourth sensing line SL4-1 and the third sub-connection part SCP3 are connected to each other through a sixth sub-contact hole SCNT6 passing through the second input insulation layer ISL-IL2. Also, the third sub-connection part SCP3 and the fourth sensing line SL4-1 may be connected to each other through a seventh sub-contact hole SCNT7 passing through the second input insulation layer ISL-IL2. As described above, the fourth sensing line SL4-1 may be electrically connected by the third sub-connection part SCP3. Also, the third sensing lines SL3-1 to SL3-10 and the fourth sensing lines SL4-1 to SL4-8 may be insulated from each other by the second input insulation layer ISL-IL2.

According various embodiments, the first sensing lines SL1-1 to SL1-10 and the second sensing lines SL2-1 to SL2-8 include at least one of a portion disposed on the same layer as the first sensing electrodes IE1-1 to IE1-10 or a portion disposed on the same layer as the second sensing electrodes IE2-1 to IE2-8.

Referring again to FIG. 8A, in a first sensing mode in which the first input TC1 (see FIG. 1) of the user is sensed, the first sensing electrodes IE1-1 to IE1-10 and the second sensing electrodes IE2-1 to IE2-8 sense the first input TC1 of the user and output the sensed signals to at least one of the first sensing lines SL1-1 to SL1-10 and the second sensing lines SL2-1 to SL2-8.

In the second sensing mode in which the second input TC2 (see FIG. 1) of the electronic pen EP is sensed, a pair of third sensing lines of the third sensing lines SL3-1 to SL3-10 and a pair of fourth sensing lines of the fourth sensing lines SL4-1 to SL4-8 sense the second input TC2 to output the sensed signals to at least one of the third sensing lines SL3-1 to SL3-10 and the fourth sensing lines SL4-1 to SL4-8. In the second sensing mode, for example, a loop provided by the third sensing line SL3-1 or SL3-2, which is one of a pair of third sensing lines, may resonant with the capacitor, which is disposed inside the electronic pen EP, to emit electromagnetic force or receive touch information.

As illustrated in FIG. 8A, the input sensor ISL2 may further include third sensing lines SL3-1 to SL3-10 and fourth sensing lines SL4-1 to SL4-8 in addition to the first sensing electrodes IE1-1 to IE1-10 and the second sensing electrodes IE2-1 to IE2-8 so as to sense the first input TC1 (see FIG. 1) and to sense the second input TC2 (see FIG. 1) of the electronic pen EP. Furthermore, since the third sensing lines SL3-1 to SL3-10 and the fourth sensing lines SL4-1 to SL4-8 are formed from the first conductive layer ISL-CL1 and the second conductive layer ISL-CL2, which are the same layers as the first sensing electrodes IE1-1 to IE1-10 and the electrodes IE2-1 to IE2-8, the input sensor ISL and the display device DD (see FIG. 2) including the input sensor ISL may be capable of sensing the first input TC1 of the user and the second input TC2 of the electronic pen EP, while minimizing (or at least reducing) an increase in production cost.

The third sensing lines SL3-1 to SL3-10 are respectively disposed between the third sub-sensor parts SSP3 and the fourth sub-sensor parts SSP4 of the second sensing parts SP2 so as not to overlap the second connection parts CP2 of the second sensing parts SP2. Thus, short-circuit failure due to the overlapping of the third sensing since each of the third sensing lines SL3-1 to SL3-10 is disposed between the third sub-sensor parts SSP3 and the fourth sub-sensor parts SSP4 of the second sensing parts SP2, an effect due to a signal inference or electrostatic discharge (ESD) between the third and fourth sub-sensor parts SSP3 and SSP4 and the third sensing lines SL3-1 to SL3-10 may be minimized or at least reduced.

The fourth sensing lines SL4-1 to SL4-10 are respectively disposed between the first sub-sensor part SSP1 and the second sub-sensor part SSP2 of the first sensing parts SP1 so as not to overlap the first connection part CP1 of the first sensor part SP1. Thus, short-circuit failure due to the overlapping of the fourth sensing lines SL4-1 to SL4-8 and the first connection part CP1 may be prevented. Also, since each of the fourth sensing lines SL4-1 to SL4-8 is disposed between the first sub-sensor part SSP1 and the second sub-sensor part SSP2 of the first sensing parts SP1, an effect due to a signal inference or electrostatic discharge (ESD) between the first and second sensor parts SSP1 and SSP2 of the first sensing parts SP1 and the fourth sensing lines SL4-1 to SL4-8 may be minimized.

Figure 9A:
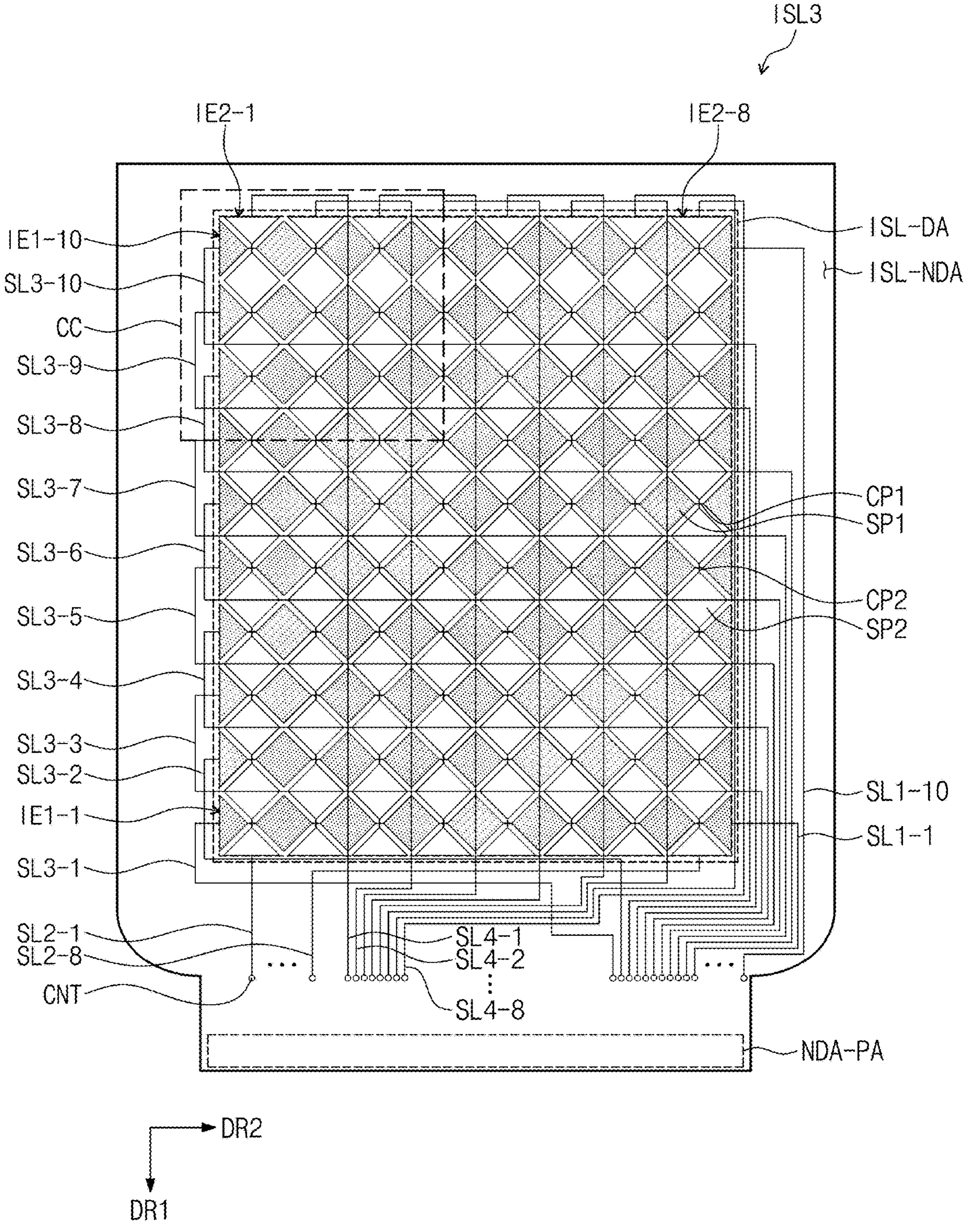
FIG. 9A is a plan view of an input sensor according to some embodiments.
Figure 9B:
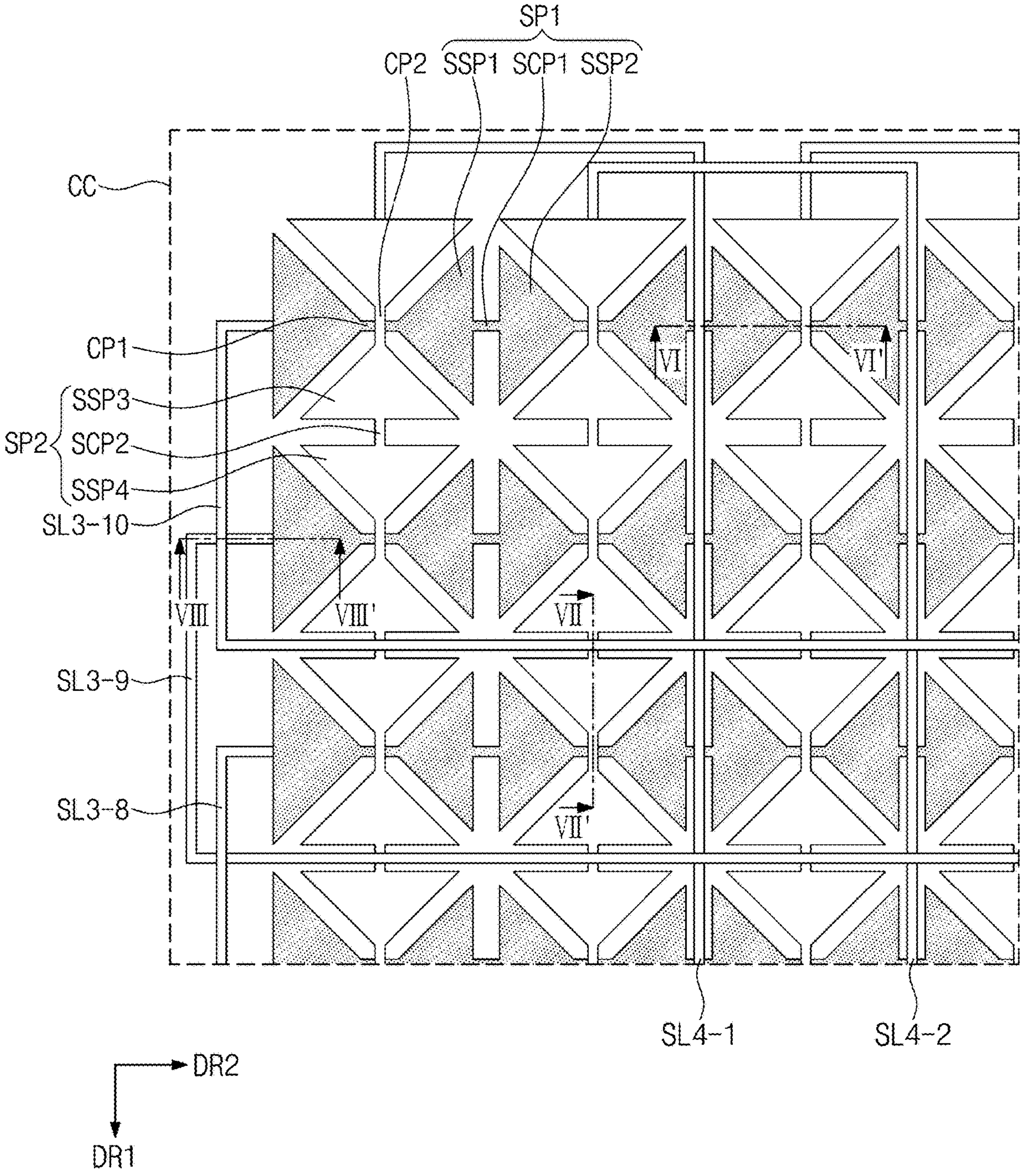
FIG. 9B is an enlarged view illustrating a third area of the input sensor of FIG. 9A according to some embodiments.
Figure 9C:
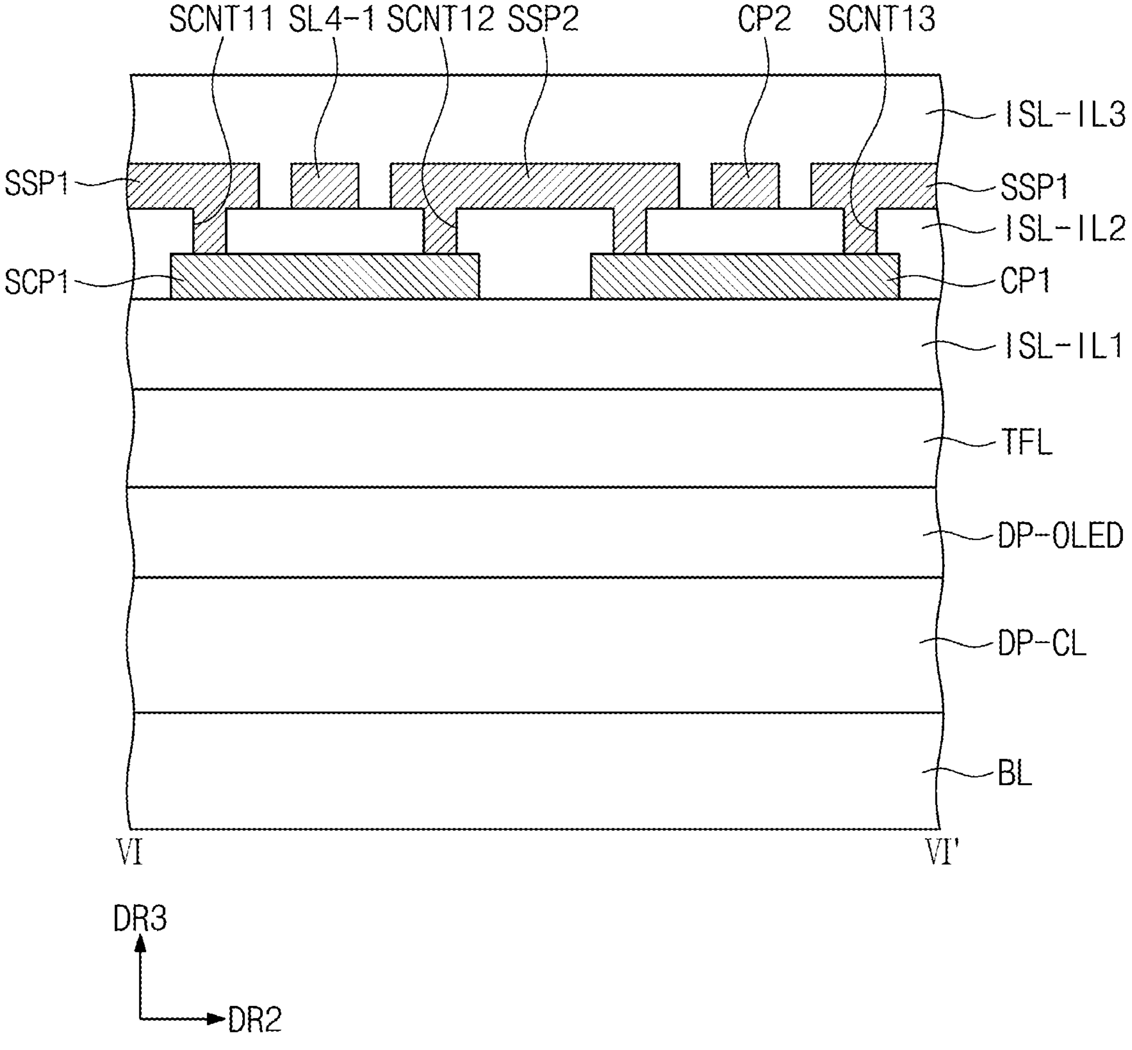
FIGS. 9C, 9D, and 9E are partial cross-sectional views of the input sensor of FIG. 9A according to some embodiments.
Figure 9D:
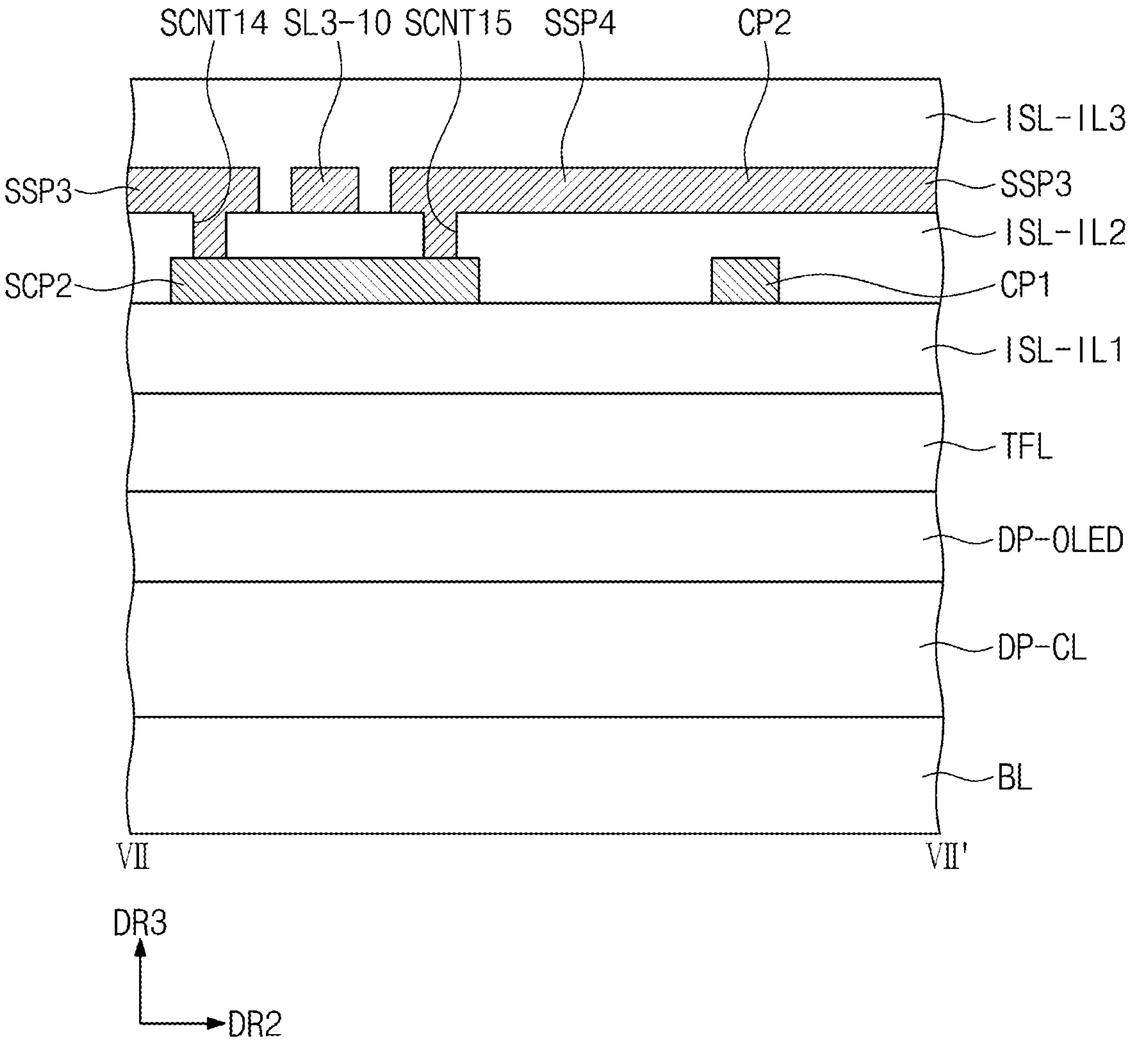
Figure 9E:
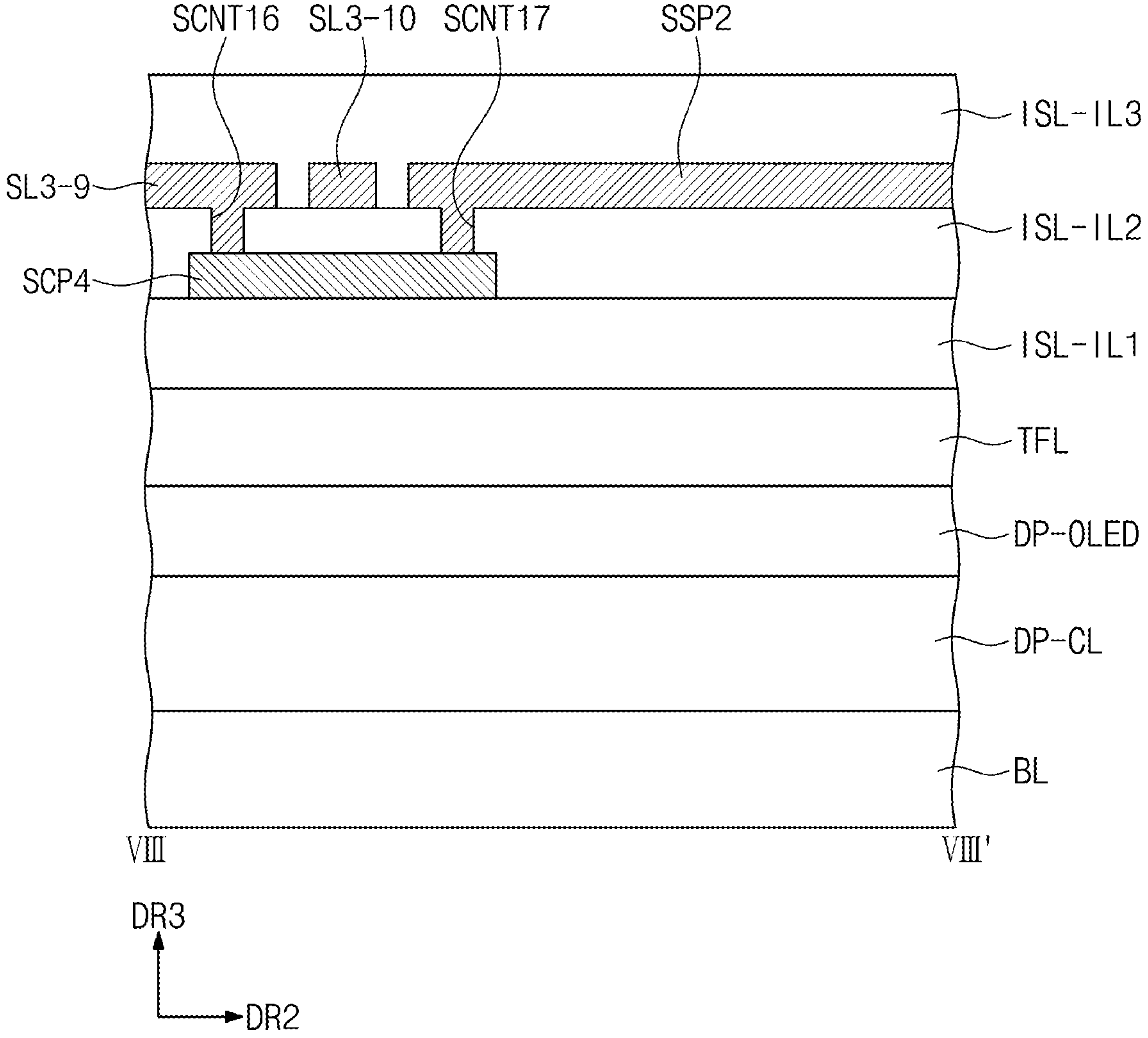

FIG. 9A is a plan view of an input sensor ISL3 according to some embodiments. FIG. 9B is an enlarged view illustrating a third area CC of the input sensor ISL3 of FIG. 9A according to some embodiments. FIGS. 9C, 9D, and 9E are partial cross-sectional views of the input sensor ISL3 according to various embodiments.

As illustrated in FIGS. 9A and 9B, the input sensor ISL3 includes first sensing electrodes IE1-1 to IE1-10, second sensing electrodes IE2-1 to IE2-8, first sensing lines SL1-1 to SL1-10, second sensing lines SL2-1 to SL2-8, third sensing lines SL3-1 to SL3-10, and fourth sensing lines SL4-1 to SL4-8. The input sensor ISL3 may include a sensing area ISL-DA and a line area ISL-NDA that respectively correspond to the display area DP-DA and the non-display area DP-NDA of the display panel DP. The sensing area ISL-DA may be defined as an area on which the first sensing electrodes IE1-1 to IE1-10 and the second sensing electrodes IE2-1 to IE2-8 are disposed. The first sensing lines SL1-1 to SL1-10, the second sensing lines SL2-1 to SL2-8, the third sensing lines SL3-1 to SL3-10, and the fourth sensing lines SL4-1 to SL4-8 are disposed on the line area ISL-NDA.

Each of the first sensing electrodes IE1-1 to IE1-10 may extend in the second direction DR2. Also, the first sensing electrodes IE1-1 to IE1-10 may be sequentially arranged in the first direction DR1. Each of the second sensing electrodes IE2-1 to IE2-8 may extend in the first direction DR1. Also, the second sensing electrodes IE2-1 to IE2-8 may be sequentially arranged in the second direction DR2.

The first sensing lines SL1-1 to SL1-10 may include the same number of signal lines as the number of the first sensing electrodes IE1-1 to IE1-10. The first sensing lines SL1-1 to SL1-10 may be connected to at least one end of both ends of each of the first sensing electrodes IE1-1 to IE1-10. The second sensing lines SL2-1 to SL2-8 may include the same number of signal lines as the number of the second sensing electrodes IE2-1 to IE2-8. The second sensing lines SL2-1 to SL2-8 may be connected to at least one end of both ends of each of the second sensing electrodes IE2-1 to IE2-8.

The first sensing lines SL1-1 to SL1-10 may be connected to some of the auxiliary lines SSL (refer to FIG. 4) disposed at one side of the pad area NDA-PA through the contact holes CNT. The second sensing lines SL2-1 to SL2-8 may be connected to some of the auxiliary lines SSL (see FIG. 4) disposed on the other side of the pad area NDA-PA through the contact holes CNT.

The contact holes CNT may pass through the insulation layers disposed between the first sensing lines SL1-1 to SL1-10 and the second sensing lines SL2-1 to SL2-8 and the auxiliary lines SSL. The contact holes CNT may pass through a portion of the first to sixth insulation layers 10 to 60 (see FIG. 5A) and then may pass through the first input insulation layer ISL-IL1 and the second input insulation layer ISL-IL2 of the input sensor ISL (see FIG. 6).

Each of the first sensing electrodes IE1-1 to IE1-10 includes a plurality of first sensing parts SP1 and a plurality of first connection parts CP1. Each of the plurality of first sensing parts SP1 includes a first sub-sensor part SSP1, a second sub-sensor part SSP2, and a first sub-connection part SCP1. The first sub-sensor part SSP1 and the second sub-sensor part SSP2 are spaced apart from each other in the second direction DR2. The first sub-connection part SCP1 electrically connects the first sub-sensor part SP1 to the second sub-sensor part SP2. A width and shape of the first sub-connection part SCP1 in the first direction DR1 are not limited to those illustrated in FIG. 8B and may be variously changed. For example, the first sub-connection part SCP1 may include a plurality of bridges arranged in parallel and spaced apart from each other in the first direction DR1 between the first sub-sensor parts SSP1 and the second sub-sensor parts SSP2.

Each of the second sensing electrodes IE2-1 to IE2-8 includes a plurality of second sensing parts SP2 and a plurality of second connection parts CP2. Each of the plurality of second sensing parts SP2 includes a third sub-sensor part SSP3, a fourth sub-sensor part SSP4, and a second sub-connection part SCP2. The third sub-sensor part SSP3 and the fourth sub-sensor part SSP4 are disposed to be spaced apart in the first direction DR1. The second sub-connection part SCP2 electrically connects the third sub-sensor part SSP3 to the fourth sub-sensor part SSP4. A width and shape of the second sub-connection part SCP2 in the second direction DR2 are not limited to those illustrated in FIG. 8B and may be variously changed. For example, the second sub-connection part SCP2 may include a plurality of bridges arranged in parallel and spaced apart from each other in the second direction DR2 between the third sub-sensor parts SSP3 and the fourth sub-sensor parts SSP4.

The third sensing lines SL3-1 to SL3-10 may include the same number of signal lines as the number of the first sensing electrodes IE1-1 to IE1-10. The third sensing lines SL3-1 to SL3-10 are disposed between the third sub-sensor parts SSP3 and the fourth sub-sensor parts SSP4 of the second sensing parts SP2, respectively. One end of each of the third sensing lines SL3-1 to SL3-10 is connected to the other end of the corresponding first sensing electrode of the first sensing electrodes IE1-1 to IE1-10. Therefore, one first sensing line of the first sensing lines SL1-1 to SL1-10, one first sensing electrode of the first sensing electrodes IE1-1 to IE1-10, and one third sensing line of the third sensing lines SL3-1 to SL3-10 may provide a signal path having a loop shape. For example, the first sensing line SL1-1, the first sensing electrode IE1-1, and the third sensing line SL3-1 may provide a loop-shaped signal path to sense the second input TC2 of the electronic pen EP (see FIG. 1).

The fourth sensing lines SL4-1 to SL4-8 may include the same number of signal lines as the number of the second sensing electrodes IE2-1 to IE2-8. The fourth sensing lines SL4-1 to SL4-8 are disposed between the first sub-sensor parts SSP1 and the second sub-sensor parts SSP2 of the first sensing parts SP1, respectively. One end of each of the fourth sensing lines SL4-1 to SL4-8 is connected to the other end of the corresponding second sensing electrode of the second sensing electrodes IE2-1 to IE2-8. Therefore, one second sensing line of the second sensing lines SL2-1 to SL2-8, one second sensing electrode of the second sensing electrodes IE2-1 to IE2-8, and one fourth sensing line of the fourth sensing lines SL4-1 to SL4-8 may provide a signal path having a loop shape. For example, the second sensing line SL2-1, the second sensing electrode IE2-1, and the fourth sensing line SL4-1 may provide a loop-shaped signal path to sense the second input TC2 of the electronic pen EP (see FIG. 1).

The third sensing lines SL3-1 to SL3-10 may be connected to some of the auxiliary lines SSL (see FIG. 4) disposed at one side of the pad area NDA-PA (see FIG. 4) through the contact holes CNT. The fourth sensing lines SL4-1 to SL4-8 may be connected to some of the auxiliary lines SSL (see FIG. 4) disposed at the other side of the pad area NDA-PA through the contact holes CNT.

The contact holes CNT may pass through the insulation layers disposed between the third sensing lines SL3-1 to SL3-10 and the fourth sensing lines SL4-1 to SL4-8 and the auxiliary lines SSL. For instance, the contact holes CNT may pass through a portion of the first to sixth insulation layers 10 to 60 (see FIG. 5A) and then may pass through the first input insulation layer ISL-IL1 (see FIG. 6) and the second input insulation layer ISL-IL2 of the input sensor ISL (see FIG. 6).

FIG. 9C is a cross-sectional view taken along sectional line VI-VI' of FIG. 9B according to some embodiments. FIG. 9D is a cross-sectional view taken along sectional line VI-VI' of FIG. 9B according to some embodiments. FIG. 9E is a cross-sectional view taken along sectional line VII-VII' of FIG. 9B according to some embodiments. For instance, FIGS. 9C to 9E illustrate an example in which the first connection part CP1 and the second connection part CP2 cross each other. In an embodiment, the first connection part CP1 may correspond to a bridge pattern, but in another embodiment, the second connection part CP2 may be the bridge pattern.

Referring to FIGS. 9B to 9E, a plurality of first connection parts CP1, a plurality of first sub-connection parts SCP1, and a plurality of second sub-connection parts SCP2 may be formed from the first conductive layer ISL-CL1 (see FIG. 6), and the plurality of first sensing parts SP1, a plurality of second sensing parts SP2, and a plurality of second connection parts CP2 may be formed from the second conductive layer ISL-CL2. The first sensing parts SP1 and the first connection parts CP1 may be connected to each other through contact holes CNT-IL2 passing through the second input insulation layer ISL-IL2. The plurality of first connection parts CP1 may be formed from the first conductive layer ISL-CL1 (see FIG. 6), and the plurality of first sensing parts SP1, the plurality of second sensing parts SP2, and the plurality of second connection parts CP2 may be formed from the second conductive layer ISL-CL2. The first sensing parts SP1 and the first connection parts CP1 may be connected to each other through contact holes CNT-IL2 passing through the second input insulation layer ISL-IL2.

In an embodiment, although the plurality of first connection parts CP1 and the plurality of second connection parts CP2 cross each other, embodiments are not limited thereto. For example, each of the first connection parts CP1 may be deformed into a "/\"-shaped curved line and/or a "\/"-shaped curved line so that the first connection parts CP1 do not overlap the second connection parts CP2. The first connection parts CP1 having the "/\"-shaped curved line and/or the "\/"-shaped curved line may overlap the second sensing parts SP2 on a plane.

As shown in FIG. 9C, the first sub-sensor parts SSP1 and the first sub-connection parts SCP1 may be connected to each other through first sub-contact holes SCNT11 passing through the second input insulation layer ISL-IL2. The second sub-sensor parts SSP2 and the first sub-connection parts SCP1 may be connected to each other through second sub-contact holes SCNT12 passing through the second input insulation layer ISL-IL2. The first sub-sensor parts SSP1 and the first connection parts CP1 may be connected to each other through third sub-contact holes SCNT12 passing through the second input insulation layer ISL-IL2. As described above, the first sub-sensor parts SSP1 and the second sub-sensor parts SSP2 may be electrically connected to each other by the first sub-connection parts SCP1 and the first connection parts CP1. Also, the first sub-sensor parts SSP1 and the fourth sensing lines SL4-1 to SL4-8 may be insulated from each other by the second input insulation layer ISL-IL2.

According some embodiments, the first sensing lines SL1-1 to SL1-10 and the second sensing lines SL2-1 to SL2-8 include at least one of a portion disposed on the same layer as the first sensing electrodes IE1-1 to IE1-10 or a portion disposed on the same layer as the second sensing electrodes IE2-1 to IE2-8.

As illustrated in FIG. 9D, the third sub-sensor parts SSP3 and the second sub-connection parts SCP2 may be connected to each other through fourth sub-contact holes SCNT14 passing through the second input insulation layer ISL-IL2. The fourth sub-sensor parts SSP4 and the second sub-connection parts SCP2 may be connected to each other through fifth sub-contact holes SCNT15 passing through the second input insulation layer ISL-IL2. As described above, the third sub-sensor parts SSP3 and the fourth sub-sensor parts SSP4 may be electrically connected to each other by the second sub-connection parts SCP2. Also, the third sub-sensor part SSP3 and the fourth sub-sensor parts SSP4 may be insulated from each other by the second input insulation layer ISL-IL2.

As illustrated in FIG. 9E, the third sensing lines (e.g., the third sensing line SL3-9) and the fourth sub-connection parts SCP4 may be connected to each other through sixth sub-contact holes SCNT16 passing through the second input insulation layer ISL-IL2. Also, the second sub-sensor parts SSP2 and the fourth sub-connection parts SCP4 may be connected to each other through seventh sub-contact holes SCNT17 passing through the second input insulation layer ISL-IL2. As described above, the third sensing lines SL3-1 to SL3-9 may be electrically connected to the second sub-sensor parts SSP2 by the fourth sub-connection part SCP4. Also, two adjacent third sensing lines (e.g., third sensing lines SL3-9 and SL3-10) of the third sensing lines SL3-1 to SL3-10 may be insulated from each other by the second input insulation layer ISL-IL2.

In FIG. 9A, a portion of the first sensing lines SL1-1 to SL1-10 and a portion of the third sensing lines SL3-1 to SL3-10 may cross each other on the line area ISL-NDA. In this case, as illustrated in FIG. 9E, one of the first sensing lines SL1-1 to SL1-10 and the third sensing lines SL3-1 to SL3-10 may be connected to the bridge pattern through the sub-connection part, such as the fourth sub-connection part SCP4. Also, the first sensing lines SL1-1 to SL1-10 and the third sensing lines SL3-1 to SL3-10 may be insulated from each other by the second input insulation layer ISL-IL2. Referring again to FIG. 9A, in a first sensing mode in which the first input TC1 (see FIG. 1) of the user is sensed, the first sensing electrodes IE1-1 to IE1-10 and the second sensing electrodes IE2-1 to IE2-8 sense the first input TC1 of the user and output the sensed signals to at least one of the first sensing lines SL1-1 to SL1-10 and the second sensing lines SL2-1 to SL2-8.

In a second sensing mode in which the second input TC2 (see FIG. 1) of the electronic pen EP is sensed, one first sensing line of the first sensing lines SL1-1 to SL1-10, one first sensing electrode of the first sensing electrodes IE1-1 to IE1-10, and one third sensing line of the third sensing lines SL3-1 to SL3-10 may sense the second input TC2. Also, in the second sensing mode, one second sensing line of the second sensing lines SL2-1 to SL2-8, one second sensing electrode of the second sensing electrodes IE2-1 to IE2-8, and one fourth sensing line of the fourth sensing lines SL4-1 to SL4-8 may sense the second input TC2.

As illustrated in FIG. 9A, the input sensor ISL3 may further include third sensing lines SL3-1 to SL3-10 and fourth sensing lines SL4-1 to SL4-8 in addition to the first sensing electrodes IE1-1 to IE1-10 and the second sensing electrodes IE2-1 to IE2-8 so as to sense the first input TC1 (see FIG. 1) and the second input TC2 (see FIG. 1) of the electronic pen EP.

Since the third sensing lines SL3-1 to SL3-10 and the fourth sensing lines SL4-1 to SL4-8 are formed from the first conductive layer ISL-CL1 and the second conductive layer ISL-CL2, which are the same as the first sensing electrodes IE1-1 to IE1-10 and the electrodes IE2-1 to IE2-8, the input sensor ISL3 and the display device DD (see FIG. 2) including the input sensor ISL3 may be capable of sensing the first input TC1 of the user and the second input TC2 of the electronic pen EP, while minimizing or at least reducing an increase in production cost.

The third sensing lines SL3-1 to SL3-10 are respectively disposed between the third sub-sensor parts SSP3 and the fourth sub-sensor parts SSP4 of the second sensing parts SP2 so as not to overlap the second connection parts CP2 of the second sensing parts SP2. Thus, short-circuit failure due to the overlapping of the third sensing since each of the third sensing lines SL3-1 to SL3-10 is disposed between the third sub-sensor parts SSP3 and the fourth sub-sensor parts SSP4 of the second sensing parts SP2, an effect due to a signal inference or electrostatic discharge (ESD) between the third and fourth sub-sensor parts SSP3 and SSP4 and the third sensing lines SL3-1 to SL3-10 may be minimized or at least reduced.

The fourth sensing lines SL4-1 to SL4-10 are respectively disposed between the first sub-sensor parts SSP1 and the second sub-sensor parts SSP2 of the first sensing parts SP1 so as not to overlap the first connection parts CP1 of the first sensing parts SP1. Thus, short-circuit failure due to the overlapping of the fourth sensing lines SL4-1 to SL4-8 and the first connection parts CP1 may be prevented. Also, since each of the fourth sensing lines SL4-1 to SL4-8 is disposed between the first sub-sensor parts SSP1 and the second sub-sensor parts SSP2 of the first sensing parts SP1, an effect due to a signal inference or electrostatic discharge (ESD) between the first and second sub-sensor parts SSP1 and SSP2 of the first sensing parts SP1 and the fourth sensing lines SL4-1 to SL4-8 may be minimized or at least reduced.

Also, in the input sensor ISL3 illustrated in FIG. 9A, the first sensing electrodes IE1-1 to IE1-10 and the second sensing electrodes IE2-1 to IE2-8 are used as a portion of the signal path for sensing the second input TC2. Accordingly, the input sensor ISL3 illustrated in FIG. 9A has higher detection resolution of the second input TC2 in the same area than that of the input sensor ISL2 described in association with FIG. 8.

Figure 10:
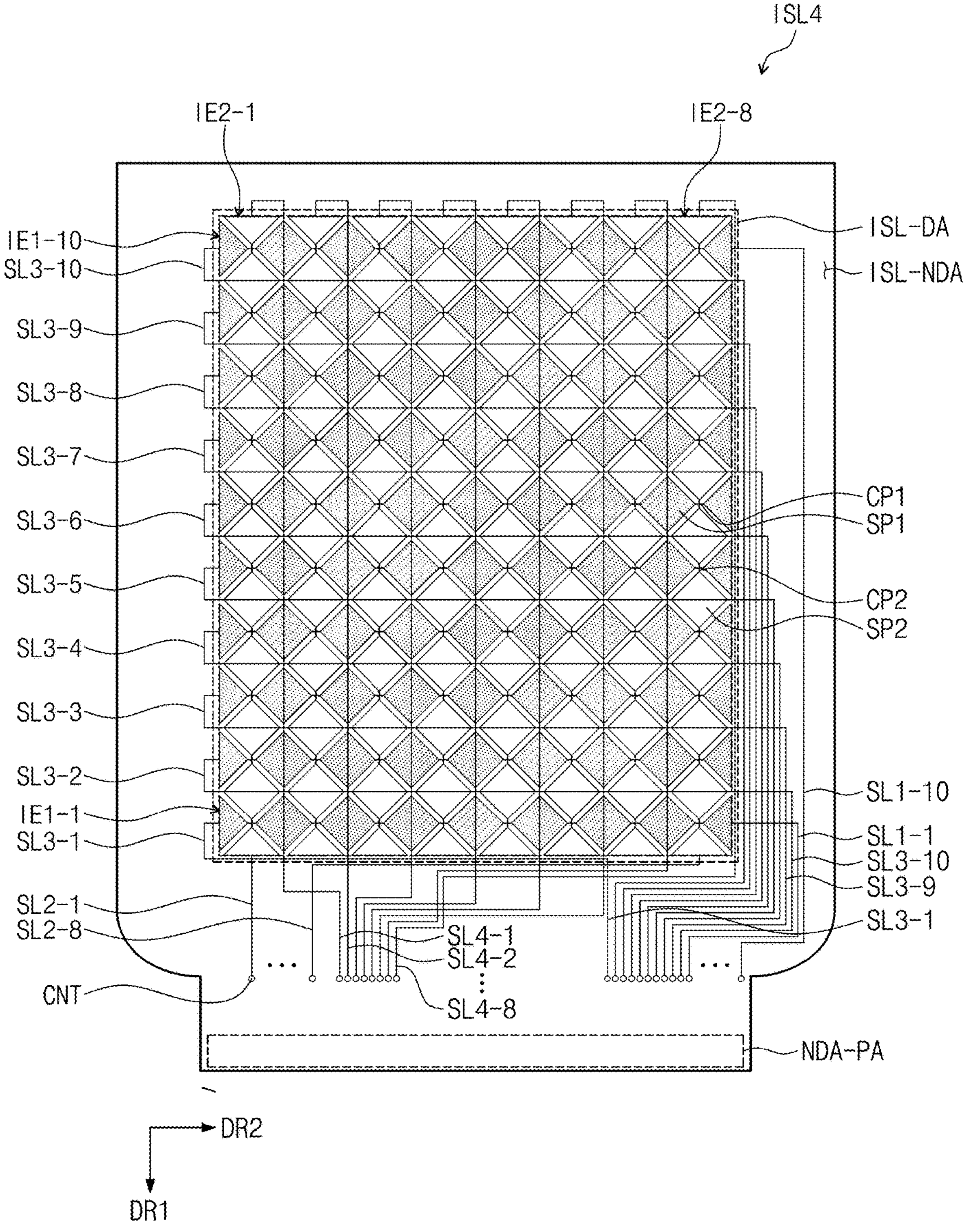
FIG. 10 is a plan view of an input sensor according to some embodiments.

FIG. 10 is a plan view of an input sensor ISL4 according to some embodiments.

Since the input sensor ISL4 illustrated in FIG. 10 has a configuration similar to that of the input sensor ISL3 described in association with FIG. 9A, duplicated descriptions will be omitted.

One end of a k-th third sensing line SL3-*k* of the third sensing lines SL3-1 to SL3-10 of the input sensor ISL3 described in association with FIG. 9A is connected to the other end of a k-th first sensing electrode IE1-*k* of the first sensing electrodes IE1-1 to IE1-10. The k-th third sensing line SL3-*k* is disposed between the third sub-sensing part SSP3 (see FIG. 9B) and the fourth sub-sensing part SSP4 (see FIG. 9B) of each of the second sensing electrodes IE2-1 to IE2-8 disposed between a (k−1)-th first sensing electrode IE1-(*k*−1) and a (k−2)-th first sensing electrode IE1-(*k*−2). For example, one end of the tenth, third sensing line SL3-10 of the input sensor ISL3 is connected to the other end of the tenth, first sensing electrode IE1-10. The tenth, third sensing line SL3-10 is disposed between the third sub-sensing parts SSP3 and the fourth sub-sensing parts SSP4 of each of the second sensing electrodes IE2-1 to IE2-8 disposed between a ninth, first sensing electrode IE1-9 and an eighth, first sensing electrode IE1-8. The second, third sensing line SL3-2 of the input sensor ISL3 described in association with FIG. 9A may be disposed at one side of the first, first sensing electrodes IE1-1. The first, third sensing line SL3-1 of the input sensor ISL3 described in association with FIG. 9A may be disposed at one side of the first, first sensing electrodes IE1-1.

One end of a k-th fourth sensing line SL4-*k* of the fourth sensing lines SL4-1 to SL4-8 of the input sensor ISL3 described in association with FIG. 9A is connected to the other end of a k-th second sensing electrode IE2-*k* of the second sensing electrodes IE2-1 to IE2-8. The k-th fourth sensing line SL4-*k* is disposed between the first sub-sensing parts SSP1 (see FIG. 9B) and the second sub-sensing parts SSP2 (see FIG. 9B) of each of the first sensing electrodes IE1-1 to IE1-10 disposed between a (k+1)-th second sensing electrode IE2-(*k*+1) and a (k+2)-th second sensing electrode IE2-(*k*+2). For example, one end of the first, fourth sensing line SL4-1 of the input sensor ISL3 is connected to the other end of the first, second sensing electrode IE2-1. The first, fourth sensing line SL4-1 is disposed between the first sub-sensing parts SSP1 and the second sub-sensing parts SSP2 of each of the first sensing electrodes IE1-1 to IE1-10 disposed between a second, second sensing electrode IE2-2 and a third, second sensing electrode IE2-3. The seventh, third sensing line SL3-7 of the input sensor ISL3 described in association with FIG. 9A is disposed at one side of the eighth, second sensing electrode IE2-8. The eighth, fourth sensing line SL4-8 of the input sensor ISL3 described in association with FIG. 9A is disposed at one side of the eighth, second sensing electrode IE2-8.

One end of the k-th third sensing line SL3-*k* of the third sensing lines SL3-1 to SL3-10 of the input sensor ISL4 described in association with FIG. 10 is connected to the other end of the k-th first sensing electrode IE1-*k* of the first sensing electrodes IE1-1 to IE1-10. The k-th third sensing line SL3-*k* is disposed between the third sub-sensing parts SSP3 and the fourth sub-sensing parts SSP4 of each of the second sensing electrodes IE2-1 to IE2-8 disposed between a k-th first sensing electrode IE1-*k* and a (k+1)-th first sensing electrode IE1-(*k*+1). The third sub-sensor parts SSP3 and the fourth sub-sensor parts SSP4 constituting the second sensing electrodes IE2-1 to IE2-8 of the input sensor ISL4 illustrated in FIG. 10, each of the first sensing electrodes IE1-1 to IE1-10 may have the same configuration as that of each of the third sub-sensing parts SSP3 and the fourth sub-sensing parts SSP4 described in association with, for instance, FIG. 9B.

One end of the k-th fourth sensing line SL4-*k* of the fourth sensing lines SL4-1 to SL4-8 of the input sensor ISL4 described in association with FIG. 10 is connected to the other end of the k-th second sensing electrode IE2-*k* of the second sensing electrodes IE2-1 to IE2-8. The k-th fourth sensing line SL4-*k* is disposed between the first sub-sensor part SSP1 and the second sub-sensor part SSP2 of each of the first sensing electrodes IE1-1 to IE1-10 disposed between the k-th second sensing electrode IE2-*k* and the (k+1)-th second sensing electrode IE2-(*k*+1). The first sub-sensor parts SSP1 and the second sub-sensor part SSP2 constituting the first sensing electrodes IE1-1 to IE1-10 of the input sensor ISL4 described in association with FIG. 10, each of the first sensing electrodes IE1-1 to IE1-10 may have the same configuration as that of each of the first sub-sensing parts SSP1 and the second sub-sensing parts SSP2 described in association with, for instance, FIG. 9B.

Figure 11:
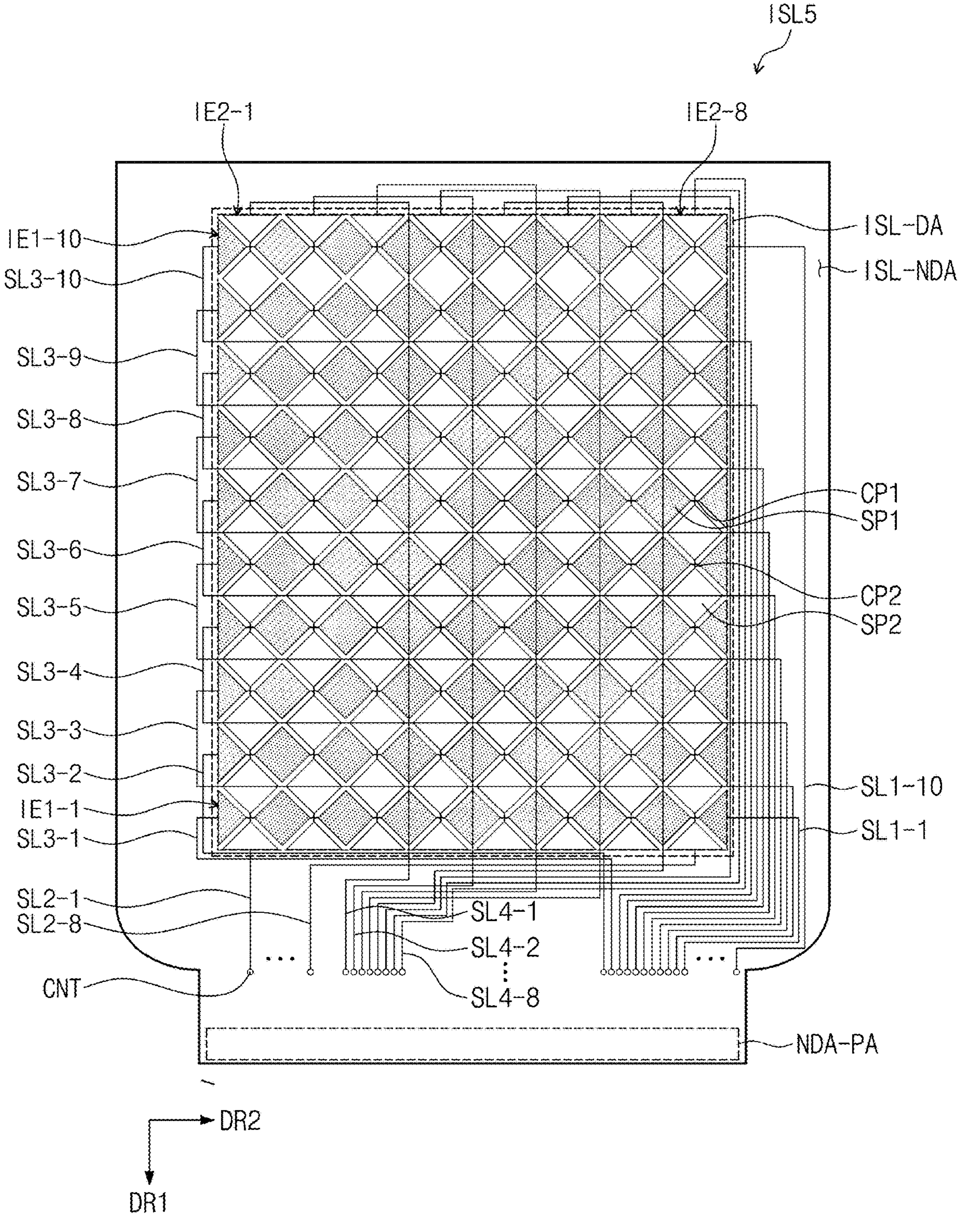
FIG. 11 is a plan view of an input sensor according to some embodiments.

FIG. 11 is a plan view of an input sensor ISL5 according to some embodiments.

Since the input sensor ISL5 described in association with FIG. 11 has a configuration similar to that of the input sensors ISL3 and ISL4 described in association with FIGS. 9A and 10, duplicated descriptions will be omitted.

One end of a k-th third sensing line SL3-*k* of the third sensing lines SL3-1 to SL3-10 of the input sensor ISL5 described in association with FIG. 11 is connected to the other end of a k-th first sensing electrode IE1-*k* of the first sensing electrodes IE1-1 to IE1-10. The k-th third sensing line SL3-*k* is disposed between the third sub-sensing parts SSP3 and the fourth sub-sensing parts SSP4 of each of the second sensing electrodes IE2-1 to IE2-8 disposed between a (k+1)-th first sensing electrode IE1-(*k*+1) and a (k+3)-th first sensing electrode IE1-(*k*+3). The third sub-sensor parts SSP3 and the fourth sub-sensor part SSP4 constituting the second sensing electrodes IE2-1 to IE2-8 of the input sensor ISL5 described in association with FIG. 11 may have the same configuration as that of each of the third sub-sensing part SSP3 and the fourth sub-sensing part SSP4 described in association with, for instance, FIG. 9B.

One end of the k-th fourth sensing line SL4-*k* of the fourth sensing lines SL4-1 to SL4-8 of the input sensor ISL4 described in association with FIG. 11 is connected to the other end of the k-th second sensing electrode IE2-*k* of the second sensing electrodes IE2-1 to IE2-8. The k-th fourth sensing line SL4-*k* is disposed between the first sub-sensing parts SSP1 and the second sub-sensing parts SSP2 of each of the first sensing electrodes IE1-1 to IE1-10 disposed between a (k+1)-th second sensing electrode IE2-(*k*+1) and a (k+2)-th second sensing electrode IE2-(*k*+2). The first sub-sensor parts SSP1 and the second sub-sensor parts SSP2 constituting the first sensing electrodes IE1-1 to IE1-10 of the input sensor ISL5 illustrated in FIG. 11 may have the same configuration as that of each of the first sub-sensing parts SSP1 and the second sub-sensing parts SSP2 described in association with, for instance, FIG. 9B.

The arranged positions of the third sensing lines SL3-1 to SL3-10 and the fourth sensing lines SL4-1 to SL4-8 are not limited to the examples illustrated in FIGS. 9A, 10, and 11, and thus, may be variously changed.

Figure 12A:
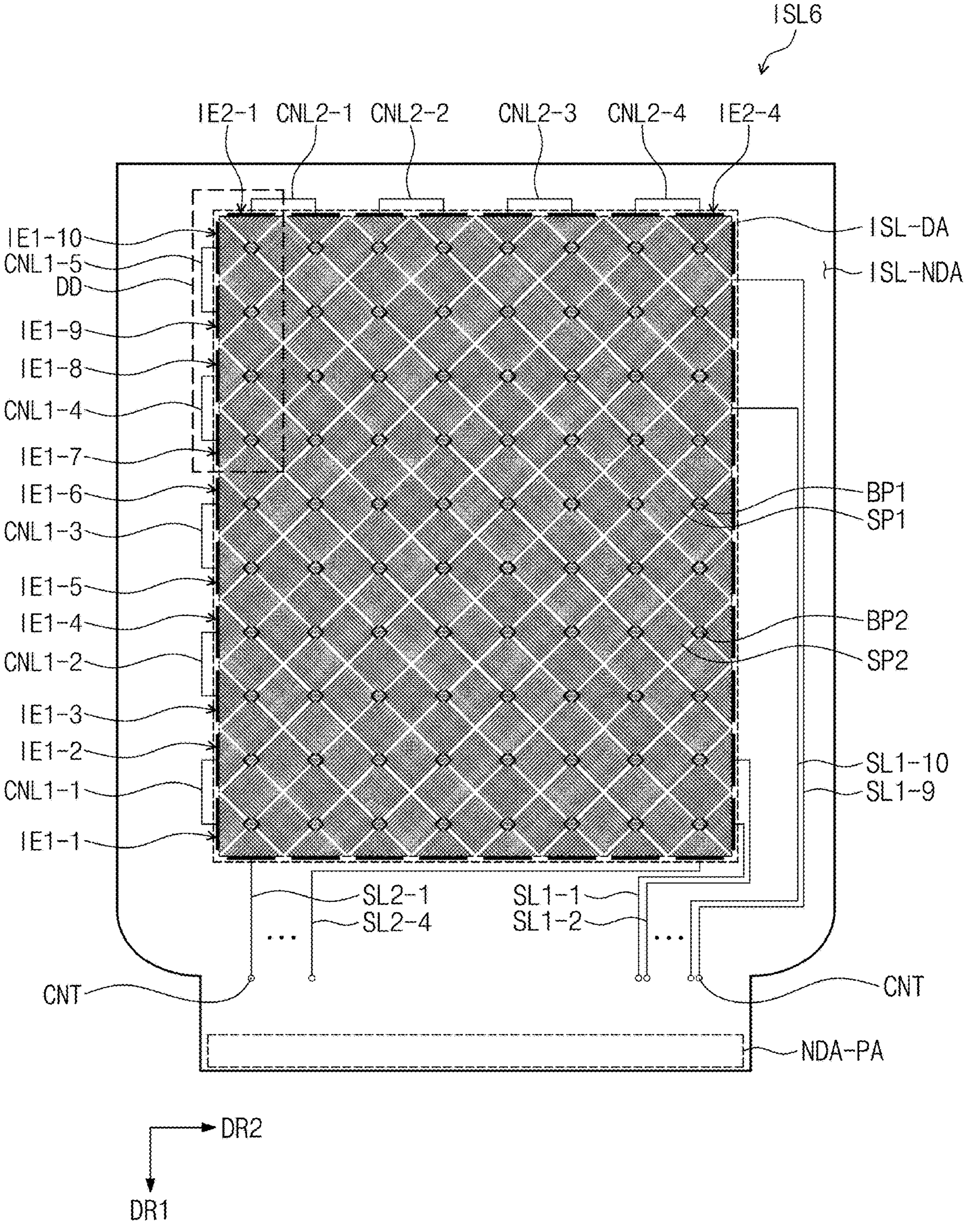
FIG. 12A is a plan view of an input sensor according to some embodiments.
Figure 12B:
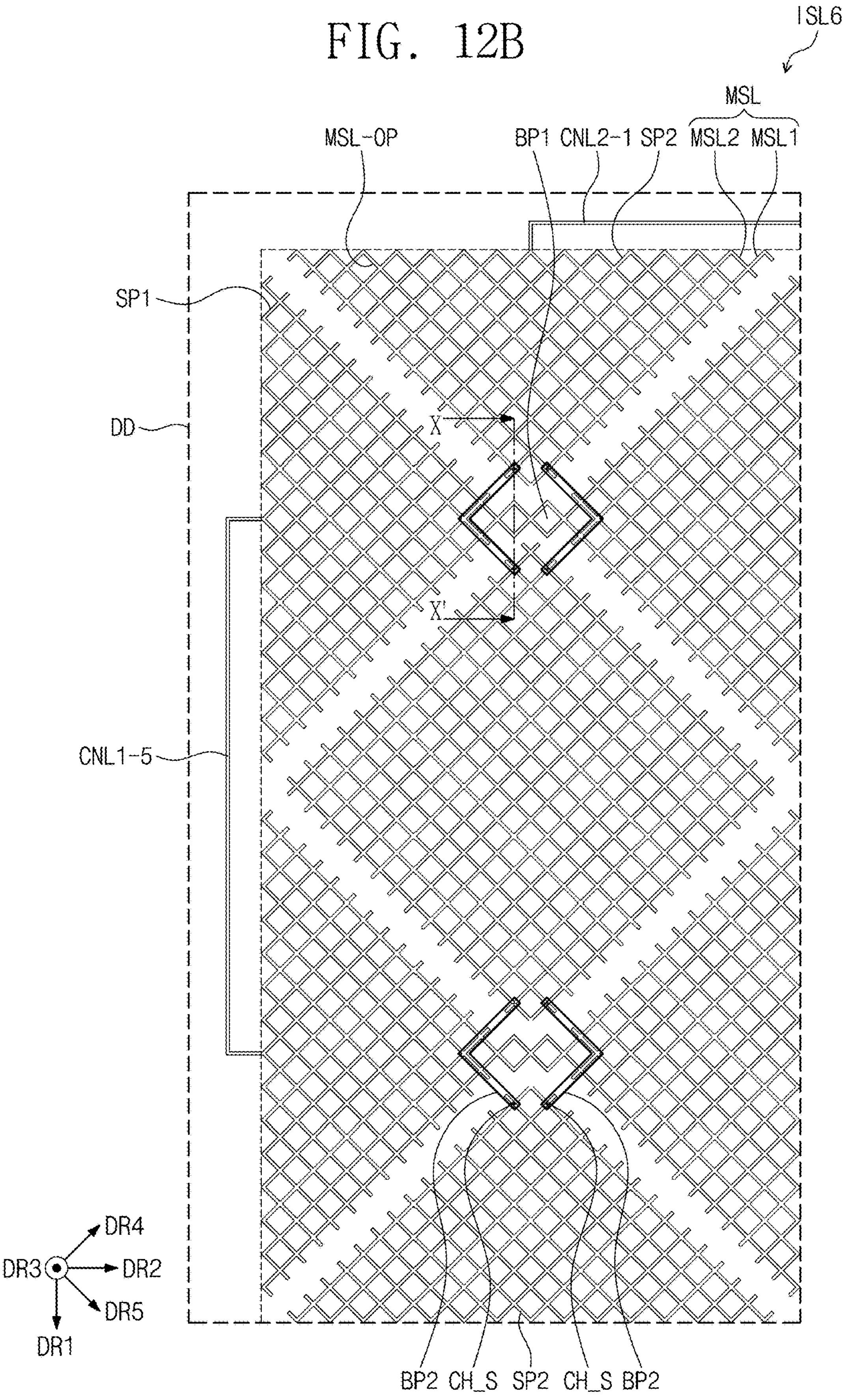
FIG. 12B is an enlarged view illustrating a fourth area of the input sensor of FIG. 12A according to some embodiments.
Figure 12C:
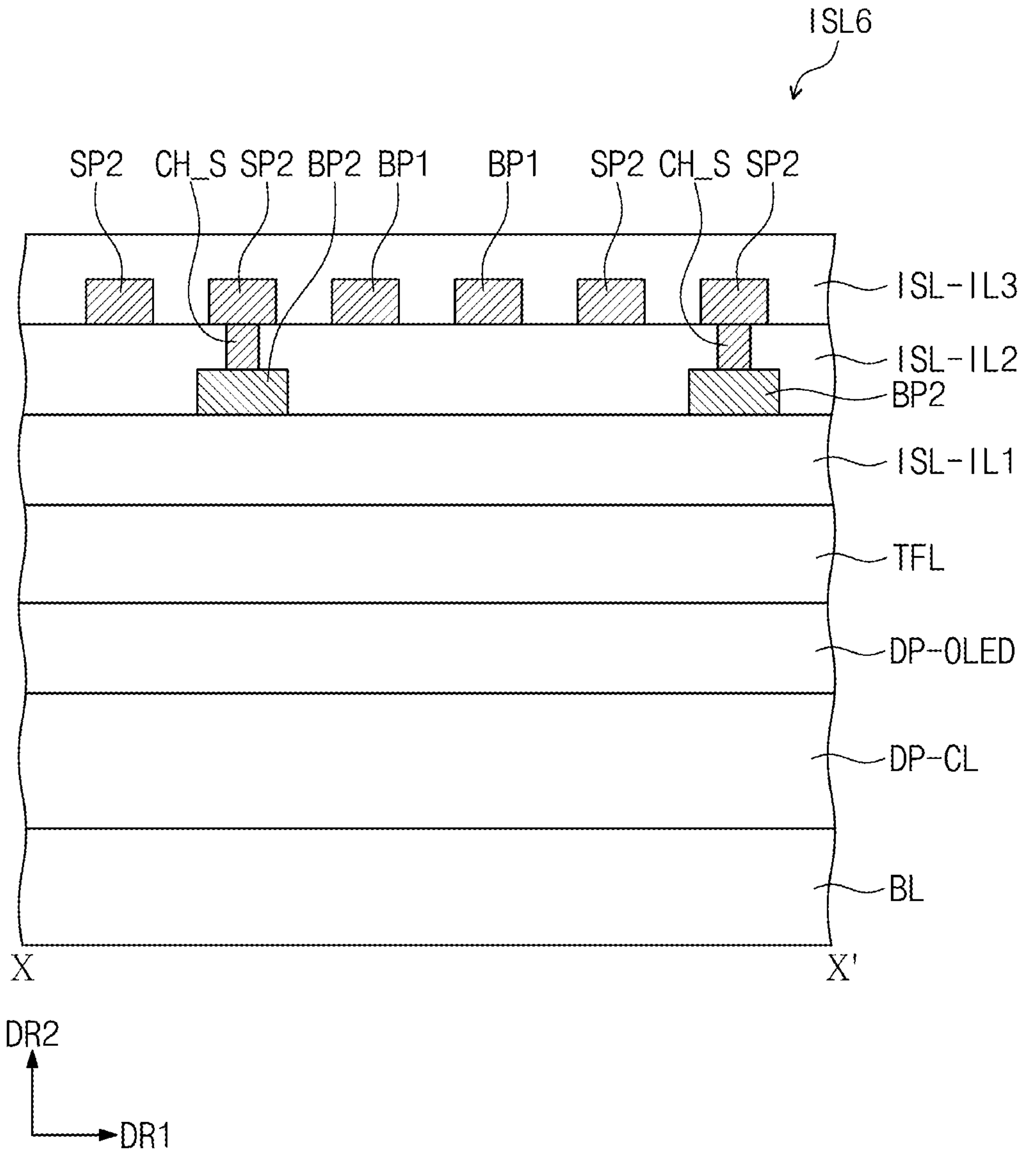
FIG. 12C is a partial cross-sectional view of the input sensor of FIG. 12B according to some embodiments.

FIG. 12A is a plan view of an input sensor ISL6 according to some embodiments. FIG. 12B is an enlarged view illustrating a fourth area DD of the input sensor ISL6 of FIG. 12A according to some embodiments. FIG. 12C is a partial cross-sectional view taken along sectional line X-X' of FIG. 12B according to some embodiments.

The input sensor ISL6 described in association with FIGS. 12A to 12C may include first sensing electrodes IE1-1 to IE1-10, second sensing electrodes IE2-1 to IE2-8, first connection Lines CNL1-1 to CNL1-5, second connection lines CNL2-1 to CNL2-4, first sensing lines SL1-1 to SL1-10, and second sensing lines SL2-1 to SL2-8 that are the same as those of the input sensor ISL described in association with at least FIG. 7A.

Each of the first sensing electrodes IE1-1 to IE1-10 includes a plurality of first sensing parts SP1 and a plurality of first connection patterns BP1. Each of the second sensing electrodes IE2-1 to IE2-8 includes a plurality of second sensing parts SP2 and a plurality of second connection patterns BP2.

As illustrated in FIG. 12B, each of the first sensing electrodes IE1-1 to IE1-10, the second sensing electrodes IE2-1 to IE2-8, and the second connection patterns BP2 of the input sensor ISL6 may include a plurality of mesh lines MSL. The mesh lines MSL include first mesh lines MSL1 extending in a fourth direction DR4 and second mesh lines MSL2 extending in a fifth direction DR5 to cross the first mesh lines MSL1. Predetermined openings MSL-OP may be defined by the first mesh lines MSL1 and the second mesh lines MSL2.

According some embodiments, the first sensing parts SP1 are disposed on the same layer as the second sensing parts SP2 and the first connection patterns BP1, and the first sensing parts SP1, the second sensing parts SP2, and the first connection patterns BP1 are disposed on a layer that is different from that of the second connection patterns BP2.

As illustrated in FIG. 12C, the first sensing parts SP1 of the first sensing electrodes IE1-1 to IE1-10 and the second sensing parts SP2 of the second sensing electrodes IE2-1 to IE2-8 are disposed on the second input insulation layer ISL-IL2. The second connection patterns BP2 are disposed on the first input insulation layer ISL-IL1. The second connection patterns BP2 may be connected to the first sensing parts SP1 through connection contact holes CH_S defined to pass through the second input insulation layer ISL-IL2.

In some embodiments, the input sensor ISL described in association with at least FIG. 7A, the input sensor ISL2 described in association with at least FIG. 8A, the input sensor ISL3 described in association with at least FIG. 9A, the input sensor ISL4 described in association with FIG. 10, and the input sensor ISL5 described in association with FIG. 11, the first sensing electrodes IE1-1 to IE1-10, the second sensing electrodes IE2-1 to IE2-8, the first connection parts CP1, and the second connection parts CP2 may include a plurality of mesh lines MSL similar to the input sensor ISL6.

According to various embodiments, an input sensor may sense a touch interaction by a user's body and a touch interaction by an electronic pen. For instance, pen sensing electrodes that sense the touch interaction by the electronic pen using conductive patterns forming the sensing electrodes that sense the user's touch interaction may be provided to minimize the thickness of the display device and reduce the production cost.

Although certain embodiments and implementations of the invention have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:

a first touch electrode comprising a first sensor pattern, a second sensor pattern and a first connection pattern electrically connected between the first sensor pattern and the second sensor pattern;

a second touch electrode comprising a third sensor pattern, a fourth sensor pattern and a second connection pattern electrically connected between the third sensor pattern and the fourth sensor pattern;

a plurality of first pen electrodes arranged along a second direction; and a plurality of second pen electrodes arranged along a first direction crossing the second direction, wherein at least two first pen electrodes among the plurality of first pen electrodes are electrically connected to each other and at least two second pen electrodes among the plurality of second pen electrodes are electrically connected to each other, wherein the first sensor pattern and the second sensor pattern are located at a same layer as that of the third sensor pattern and the fourth sensor pattern, and wherein the first connection pattern is located at a same layer as that of the second connection pattern.

2. The display device of claim 1, wherein:

the first connection pattern and the second connection pattern are formed from a first conductive layer, the first sensor pattern, the second sensor pattern, the third sensor pattern and the fourth sensor pattern are formed from a second conductive layer, and an insulation layer is disposed between the first conductive layer and the second conductive layer.

3. The display device of claim 2, wherein the plurality of first pen electrodes and the plurality of second pen electrodes are formed from the second conductive layer.

4. The display device of claim 3, wherein:

the first touch electrode arranged along the second direction, the second touch electrode arranged along the first direction, the first sensor pattern and the second sensor pattern are spaced apart from each other in the second direction, and the third sensor pattern and the fourth sensor pattern are spaced part from each other in the first direction.

5. The display device of claim 4, wherein at least one of the plurality of first pen electrodes overlaps with the second connection pattern, and wherein at least one of the plurality of second pen electrodes overlaps with the first connection pattern.

6. The display device of claim 1, wherein:

the first touch electrode and the second touch electrode are configured to transmit a touch signal during a first sensing mode, and the plurality of first pen electrodes and the plurality of second pen electrodes are configured to transmit a pen signal during a second sensing mode.

7. The display device of claim 1, wherein:

the plurality of first pen electrodes comprise a plurality of first sensing lines, and the plurality of second pen electrodes comprise a plurality of second sensing lines.

8. The display device of claim 7, wherein:

at least two first sensing lines among the plurality of first sensing lines are electrically connected to each other, and at least two second sensing lines among the plurality of second sensing lines are electrically connected to each other.

9. An input sensor comprising:

a plurality of first touch electrodes, each of which comprise a first sensor pattern, a second sensor pattern and a first connection pattern electrically connected between the first sensor pattern and the second sensor pattern;

a plurality of second touch electrodes, each of which comprise a third sensor pattern, a fourth sensor pattern and a second connection pattern electrically connected between the third sensor pattern and the fourth sensor pattern;

a plurality of first pen electrodes arranged along a second direction; and a plurality of second pen electrodes arranged along a first direction crossing the second direction, wherein at least two first pen electrodes among the plurality of first pen electrodes are electrically connected to each other and at least two second pen electrodes among the plurality of second pen electrodes are electrically connected to each other, wherein the first sensor pattern and the second sensor pattern are located at a same layer as that of the third sensor pattern and the fourth sensor pattern, and wherein the first connection pattern is located at a same layer as that of the second connection pattern, wherein the plurality of first touch electrodes and the plurality of second touch electrodes are configured to transmit a touch signal during a touch sensing mode, and wherein the plurality of first pen electrodes and the plurality of second pen electrodes are configured to transmit a pen signal during a pen sensing mode.

10. The input sensor of claim 9, wherein:

the first connection pattern and the second connection pattern are formed from a first conductive layer, the first to fourth sensor patterns, the plurality of first pen electrodes and the plurality of second pen electrodes are formed from a second conductive layer, and an insulation layer is disposed between the first conductive layer and the second conductive layer.

11. The input sensor of claim 9, wherein:

the first sensor pattern and the second sensor pattern are spaced apart from each other in the second direction; and the third sensor pattern and the fourth sensor pattern are spaced part from each other in the first direction.

12. The input sensor of claim 11, wherein at least one of the plurality of first pen electrodes overlaps with the second connection pattern of at least one of among the plurality of second touch electrodes, and wherein at least one of the plurality of second pen electrodes overlaps with the first connection pattern of at least one of among the plurality of first touch electrodes.

13. The input sensor of claim 9, wherein:

the plurality of first pen electrodes comprise a plurality of first sensing lines; and the plurality of second pen electrodes comprise a plurality of second sensing lines.

14. The input sensor of claim 13, wherein:

at least two first sensing lines among the plurality of first sensing lines are electrically connected to each other, and at least two second sensing lines among the plurality of second sensing lines are electrically connected to each other.

15. An electronic device comprising:

a display panel;

an input sensor disposed on a first surface of the display panel; and a sensing circuit configured to receive a touch input and a pen input from the input sensor, wherein the input sensor comprises:

a first touch electrode comprising a first sensor pattern, a second sensor pattern and a first connection pattern electrically connected between the first sensor pattern and the second sensor pattern;

a second touch electrode comprising a third sensor pattern, a fourth sensor pattern and a second connection pattern electrically connected between the third sensor pattern and the fourth sensor pattern;

a plurality of first pen electrodes arranged along a second direction; and a plurality of second pen electrodes arranged along a first direction crossing the second direction, wherein at least two first pen electrodes among the plurality of first pen electrodes are electrically connected to each other and at least two second pen electrodes among the plurality of second pen electrodes are electrically connected to each other, wherein the first sensor pattern and the second sensor pattern are located at a same layer as that of the third sensor pattern and the fourth sensor pattern, and wherein the first connection pattern is located at a same layer as that of the second connection pattern.

16. The electronic device of claim 15, wherein:

the first connection pattern and the second connection pattern are formed from a first conductive layer, the first sensor pattern, the second sensor pattern, the third sensor pattern and the fourth sensor pattern are formed from a second conductive layer, and an insulation layer is disposed between the first conductive layer and the second conductive layer.

17. The electronic device of claim 16, wherein:

the plurality of first pen electrodes and the plurality of second pen electrodes are formed from the second conductive layer.

18. The electronic device of claim 17, wherein:

the first sensor pattern and the second sensor pattern are spaced apart from each other in the second direction, and the third sensor pattern and the fourth sensor pattern are spaced part from each other in the first direction.

19. The electronic device of claim 18, wherein at least one of the plurality of first pen electrodes overlaps with the second connection pattern, and wherein at least one of the plurality of second pen electrodes overlaps with the first connection pattern.

20. The electronic device of claim 16, wherein:

the first touch electrode and the second touch electrode are configured to transmit a touch signal during a first sensing mode, and the plurality of first pen electrodes and the plurality of second pen electrodes are configured to transmit a pen signal during a second sensing mode.

* * * * *